United States Patent
Kim et al.

(10) Patent No.: US 10,186,460 B2
(45) Date of Patent: Jan. 22, 2019

(54) SEMICONDUCTOR DEVICES

(71) Applicant: SAMSUNG ELECTRONICS CO., LTD., Suwon-si, Gyeonggi-do (KR)

(72) Inventors: Sangsu Kim, Yongin-si (KR); Yunsang Shin, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/651,018

(22) Filed: Jul. 17, 2017

(65) Prior Publication Data

US 2018/0174920 A1    Jun. 21, 2018

(30) Foreign Application Priority Data

Dec. 16, 2016 (KR) ......................... 10-2016-0172823

(51) Int. Cl.
*H01L 21/321* (2006.01)
*H01L 21/308* (2006.01)
(Continued)

(52) U.S. Cl.
CPC ............... *H01L 21/823814* (2013.01); *H01L 21/02019* (2013.01); *H01L 21/02065* (2013.01);
(Continued)

(58) Field of Classification Search
CPC ............... H01L 27/092; H01L 27/0617; H01L 29/0847; H01L 21/8238; H01L 21/823814; H01L 21/76837; H01L 21/02019; H01L 21/02065

USPC ............... 257/288, 369, 392, 401, 410, 412, 257/E29.255, E21.19; 438/294, 585, 591, 438/592, 595

See application file for complete search history.

(56) References Cited

U.S. PATENT DOCUMENTS 5,949,090 A    9/1999  Iwasa et al.
7,068,058 B2   6/2006  Park et al.
(Continued)

FOREIGN PATENT DOCUMENTS

| JP | 2003-258051 A | 9/2003 |
| JP | 5381455 B2 | 1/2014 |
| JP | 5493865 B2 | 5/2014 |
| KR | 10-0881848 B1 | 1/2009 |

*Primary Examiner* — Dao H Nguyen
(74) *Attorney, Agent, or Firm* — Lee & Morse, P.C.

(57) ABSTRACT

A semiconductor device including a semiconductor substrate including first regions and second regions, at least one of the first regions being disposed between adjacent second regions; a plurality of first gate structures on the first regions of the semiconductor substrate; and a plurality of second gate structures on the second regions of the semiconductor substrate, wherein each of the first and second gate structures includes a lower gate structure including a recess region defined by sidewalls and a bottom connecting the sidewalls; and an upper gate structure including a gap-fill metal pattern that fills the recess region of the lower gate structure, wherein the bottom of the lower gate structure included in the first gate structure has a thickness different from a thickness of the bottom of the lower gate structure included in the second gate structure, and wherein the gap-fill metal patterns of the first and second gate structures have top surfaces at substantially a same level.

18 Claims, 23 Drawing Sheets

(51) Int. Cl.
*H01L 27/092* (2006.01)
*H01L 27/088* (2006.01)
*H01L 29/49* (2006.01)
*H01L 21/8238* (2006.01)
*H01L 21/768* (2006.01)
*H01L 21/02* (2006.01)
*H01L 27/06* (2006.01)
*H01L 29/08* (2006.01)

(52) U.S. Cl.
CPC .... *H01L 21/76837* (2013.01); *H01L 21/8238* (2013.01); *H01L 21/82385* (2013.01); *H01L 27/0617* (2013.01); *H01L 27/092* (2013.01); *H01L 29/0847* (2013.01); *H01L 21/823842* (2013.01)

(56) References Cited

U.S. PATENT DOCUMENTS

| | | |
|---|---|---|
| 9,165,836 B1 | 10/2015 | Xie et al. |
| 9,685,520 B1* | 6/2017 | Hsu .................... H01L 29/4236 |
| 2006/0163571 A1 | 7/2006 | Lim et al. |
| 2008/0038851 A1 | 2/2008 | Koyama et al. |
| 2014/0363960 A1* | 12/2014 | Kim .................. H01L 21/82345 438/585 |
| 2016/0276224 A1* | 9/2016 | Gan ................ H01L 21/823842 |
| 2016/0336194 A1* | 11/2016 | Yeh ................ H01L 21/823821 |
| 2017/0062282 A1* | 3/2017 | Lin ..................... H01L 27/0922 |
| 2017/0309520 A1* | 10/2017 | Liou .............. H01L 21/823456 |
| 2017/0352670 A1* | 12/2017 | Hsieh ................ H01L 27/11273 |

* cited by examiner

US 10,186,460 B2

SEMICONDUCTOR DEVICES

CROSS-REFERENCE TO RELATED APPLICATIONS

Korean Patent Application No. 10-2016-0172823 filed on Dec. 16, 2016 in the Korean Intellectual Property Office, and entitled: "Semiconductor Devices," is incorporated by reference herein in its entirety.

BACKGROUND

1. Field

Embodiments relate to a semiconductor device.

2. Description of the Related Art

A semiconductor device may include an integrated circuit that includes metal oxide semiconductor field effect transistors (MOSFETs).

SUMMARY

The embodiments may be realized by providing a semiconductor device including a semiconductor substrate including first regions and second regions, at least one of the first regions being disposed between adjacent second regions; a plurality of first gate structures on the first regions of the semiconductor substrate; and a plurality of second gate structures on the second regions of the semiconductor substrate, wherein each of the first and second gate structures includes a lower gate structure including a recess region defined by sidewalls and a bottom connecting the sidewalls; and an upper gate structure including a gap-fill metal pattern that fills the recess region of the lower gate structure, wherein the bottom of the lower gate structure included in the first gate structure has a thickness different from a thickness of the bottom of the lower gate structure included in the second gate structure, and wherein the gap-fill metal patterns of the first and second gate structures have top surfaces at substantially a same level.

The embodiments may be realized by providing a semiconductor device including a first gate structure extending across first active patterns on a first region of a semiconductor substrate; and a second gate structure extending across second active patterns on a second region of the semiconductor substrate, wherein each of the first and second gate structures includes a lower gate structure including a recess region defined by sidewalls and a bottom connecting the sidewalls; and an upper gate structure including a gap-fill metal pattern that fills the recess region of the lower gate structure, wherein the bottom of the lower gate structure included in the first gate structure has a thickness that is different from a thickness of the bottom of the lower gate structure included in the second gate structure, and wherein the gap-fill metal patterns of the first and second gate structures have top surfaces at substantially a same level.

The embodiments may be realized by providing a semiconductor device including a semiconductor substrate including a first region between adjacent second regions; a plurality of first gate structures on the first region of the semiconductor substrate; and a plurality of second gate structures on the second regions of the semiconductor substrate, wherein each of the first gate structures includes a U-shaped first lower gate structure; and a first upper gate structure, the first upper gate including a gap-fill metal pattern that fills the U-shaped first lower gate structure, wherein each of the second gate structures includes a U-shaped second lower gate structure; and a second upper gate structure, the second upper gate including a gap-fill metal pattern that fills the U-shaped second lower gate structure, wherein a thickness of the first lower gate structure is different from a thickness of the second lower gate structure, and wherein a top surface of the gap-fill metal pattern of the first gate structure is at substantially a same level as a top surface of the gap-fill metal pattern of the second gate structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
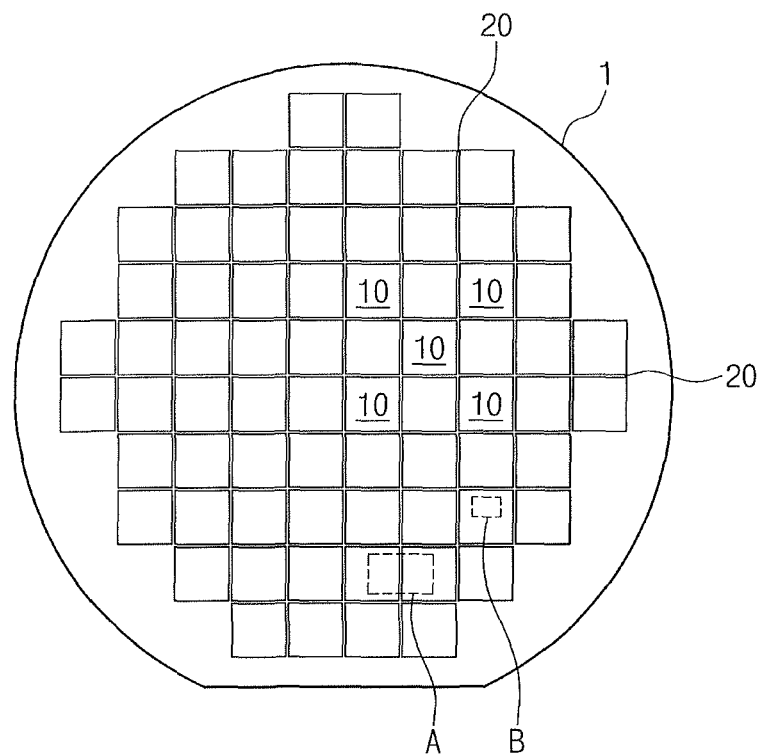
FIG. 1 illustrates a plan view of a substrate with integrated semiconductor devices according to exemplary embodiments.
Figure 2:
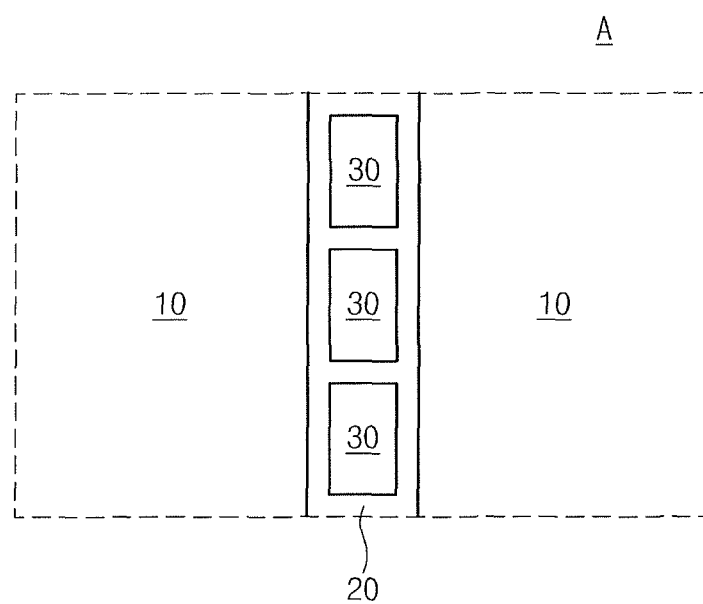
FIG. 2 illustrates an enlarged view of section A shown in FIG. 1.

FIG. 1 illustrates a plan view of a substrate with integrated semiconductor devices according to exemplary embodiments. FIG. 2 illustrates an enlarged view of section A shown in FIG. 1.

Referring to FIGS. 1 and 2, a substrate 1 (e.g., a wafer) may include chip regions 10 (where a semiconductor chip is formed) and a scribe line region 20 (between the chip regions 10). The chip regions 10 may be two-dimensionally arranged on an entire surface of the substrate 1, and each of the chip regions 10 may be surrounded by the scribe line region 20. For example, the scribe line region 20 may be disposed between the chip regions 10.

A logic device, a memory device, a control device, and so forth may be provided on the substrate 1 at each of the chip regions 10. The chip regions 10 may be provided thereon with standard cells such as a logical sum gate or a logical product gate. For example, the standard cell may include a basic cell (e.g., a AND gate, an OR gate, a NOR gate, or an inverter), a complex cell (e.g., OAI (OR/AND/Inverter) gates and AOI (AND/OR/Inverter)), or a storage element (e.g., a simple master-slave flip-flop and a latch). The standard cells may be composed of a plurality of FinFET devices.

Test element groups (TEGs) 30 may be provided on a portion of the chip region 10 or the scribe line region 20 to evaluate electrical characteristics of semiconductor elements. The test element groups 30 may include a plurality of test structures and a plurality of test pads. The test pads may be connected through conductive lines to the test structures.

The test structures may include semiconductor elements having the same structure as that of semiconductor elements formed on the chip region 10. In an implementation, each of the test structures may include a plurality of semiconductor oxide field effect transistors (MOSFETs).

Figure 3A:
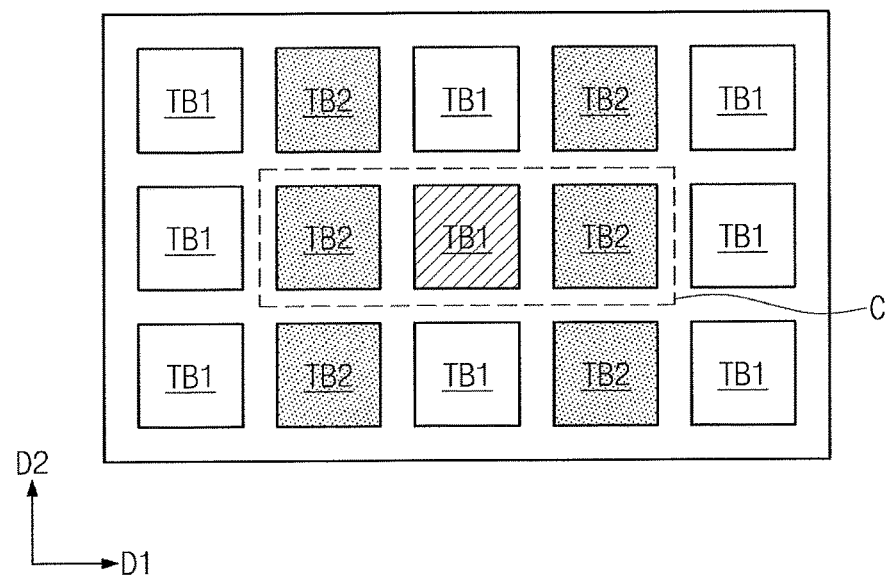
FIGS. 3A and 3B illustrate plan views briefly showing test element groups of FIG. 2.
Figure 3B:
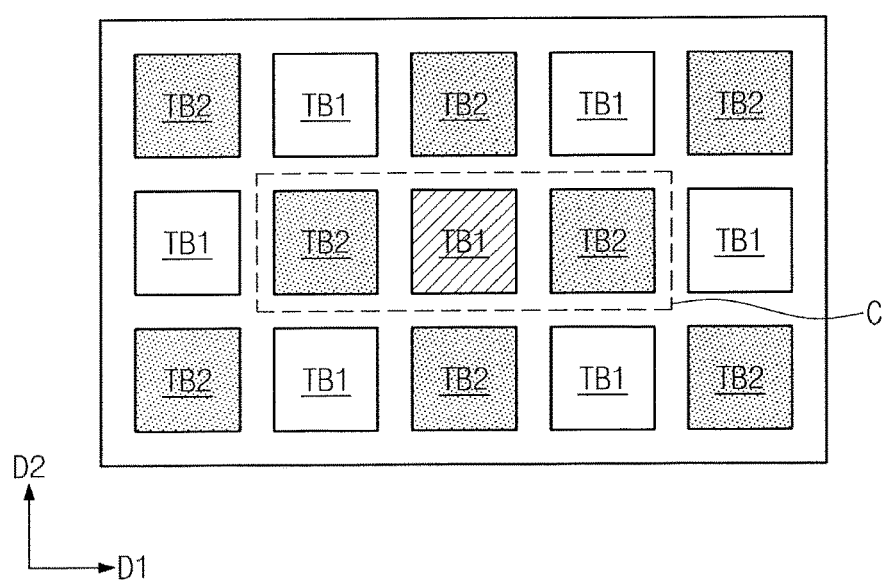

FIGS. 3A and 3B illustrate plan views briefly showing test element groups of FIG. 2.

Referring to FIGS. 3A and 3B, the test element group 30 of a semiconductor device may include a plurality of test blocks TB1 and TB2.

The test blocks TB1 and TB2 may be arranged in a matrix form along first and second directions D1 and D2 crossing each other. In an implementation, the plurality of the test blocks may include first test blocks TB1 and second test blocks TB2.

The first test blocks TB1 may include first MOSFETs (referred to hereinafter as transistors), and the second test blocks TB2 may include second transistors. The first transistors may have a first threshold voltage, and the second transistors may have a second threshold voltage that is different from the first threshold voltage. In an implementation, the first test blocks TB1 may include NMOS transistors, and the second test blocks TB2 may include PMOS transistors. In an implementation, the first test blocks TB1 may include NMOS transistors having a first threshold voltage, and the second test blocks TB2 may include NMOS transistors having a second threshold voltage. In an implementation, the first test blocks TB1 may include PMOS transistors having a first threshold voltage, and the second test blocks TB2 may include PMOS transistors having a second threshold voltage.

In an implementation, one of the first and second test blocks TB1 and TB2 may be a target test block (e.g., a hatched block of FIGS. 3A and 3B) connected to the test pads. For example, the target test block may be one of the first test blocks TB1. The target test block TB1 may be surrounded by the test blocks TB1 and TB2 (e.g., dummy test blocks), which are provided to more uniformly form gate electrodes in the target test block when processes (e.g., CMP processes and etching processes) are performed to form the target test block TB1.

Referring to FIG. 3A, the first and second test blocks TB1 and TB2 may be alternately arranged along the first direction D1. The first test blocks TB1 may be arranged adjacent to each other in the second direction D2, and the second test blocks TB2 may be arranged adjacent to each other in the second direction D2. For example, the target test block may be one of the first test blocks TB1 and may be positioned between the second test blocks TB2 that are adjacent to each other in the first direction D1.

Referring to FIG. 3B, the first and second test blocks TB1 and TB2 may be alternately arranged along the first and second directions D1 and D2. For example, the target test block may be one of the first test blocks TB1 and may be positioned between the second test blocks TB2 adjacent to each other in the first direction D1 and between the second test blocks TB2 adjacent to each other in the second direction D2.

Figure 4:
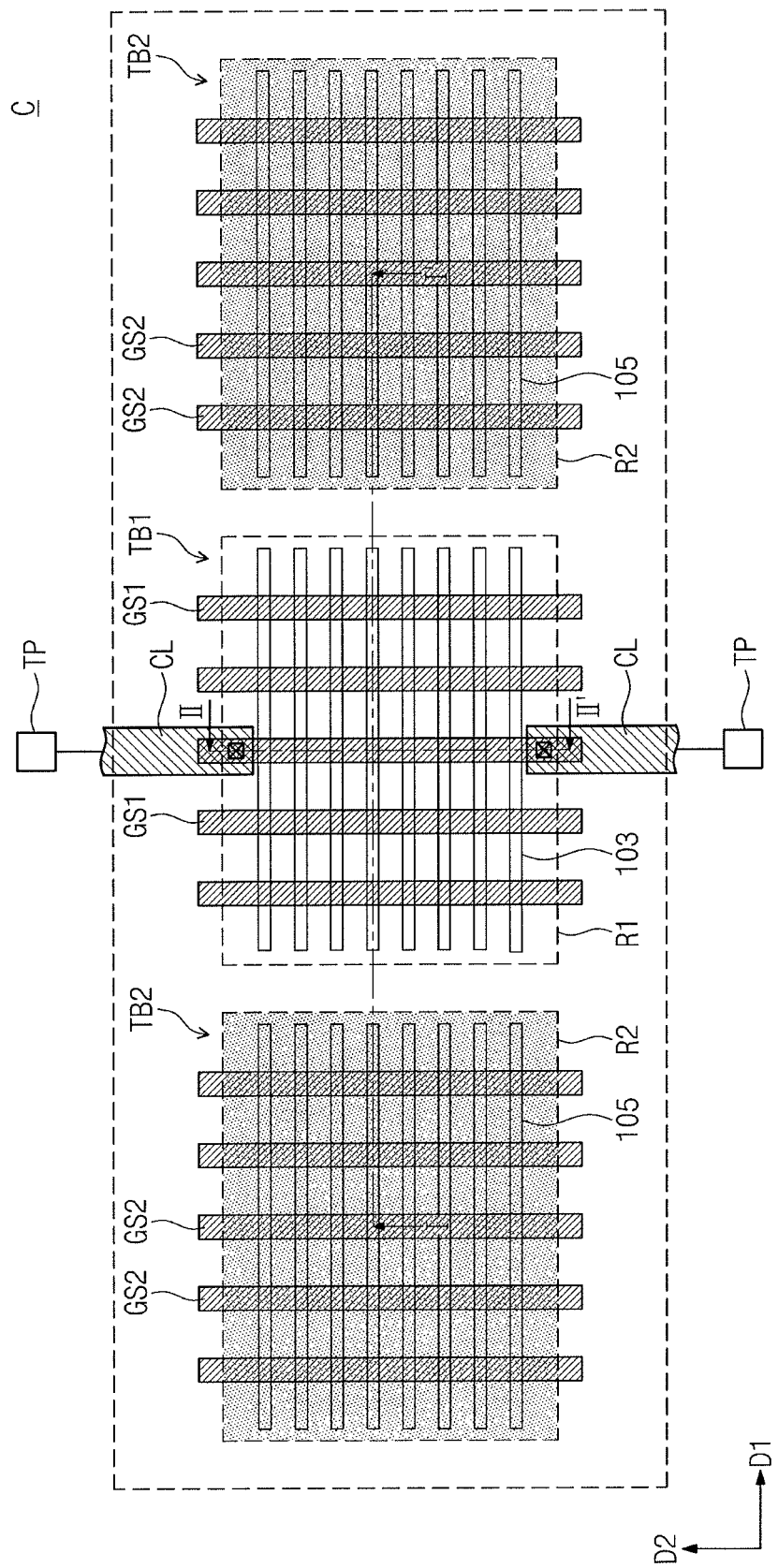
FIG. 4 illustrates an enlarged view of section C shown in FIGS. 3A and 3B.
Figure 5A:
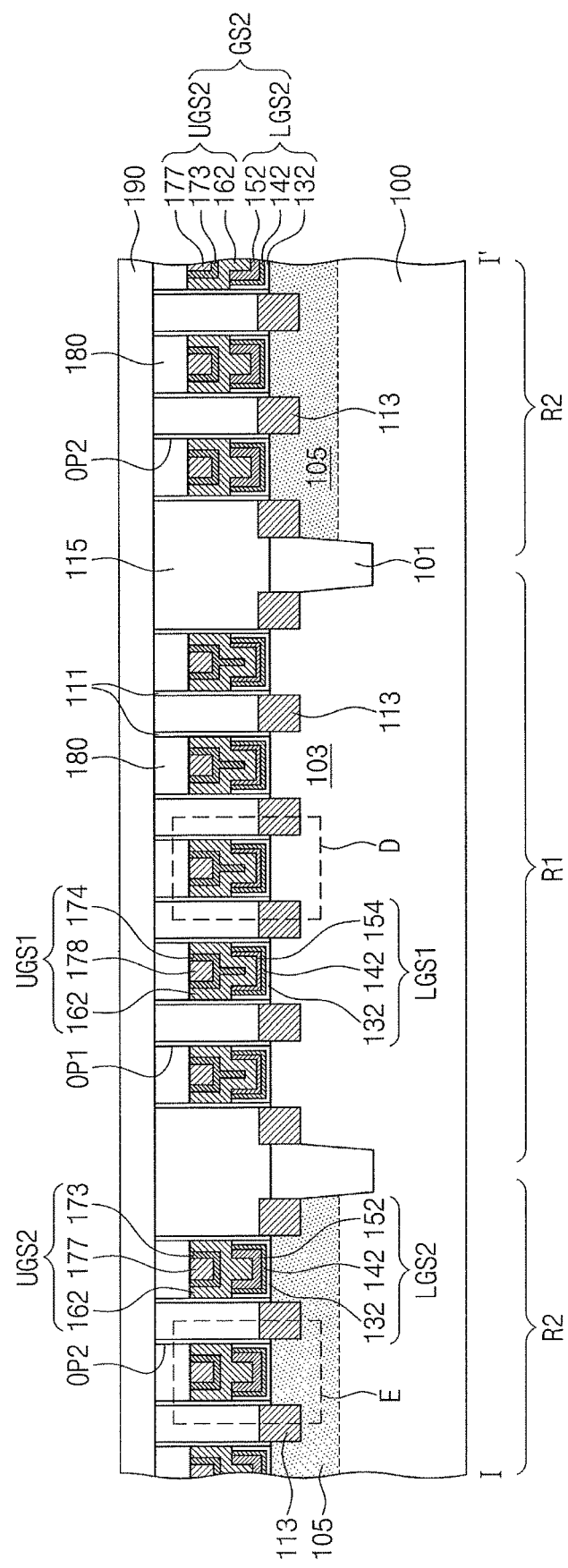
FIGS. 5A and 5B illustrate cross-sectional views taken along lines I-I' and II-II' of FIG. 4, respectively.
Figure 5B:
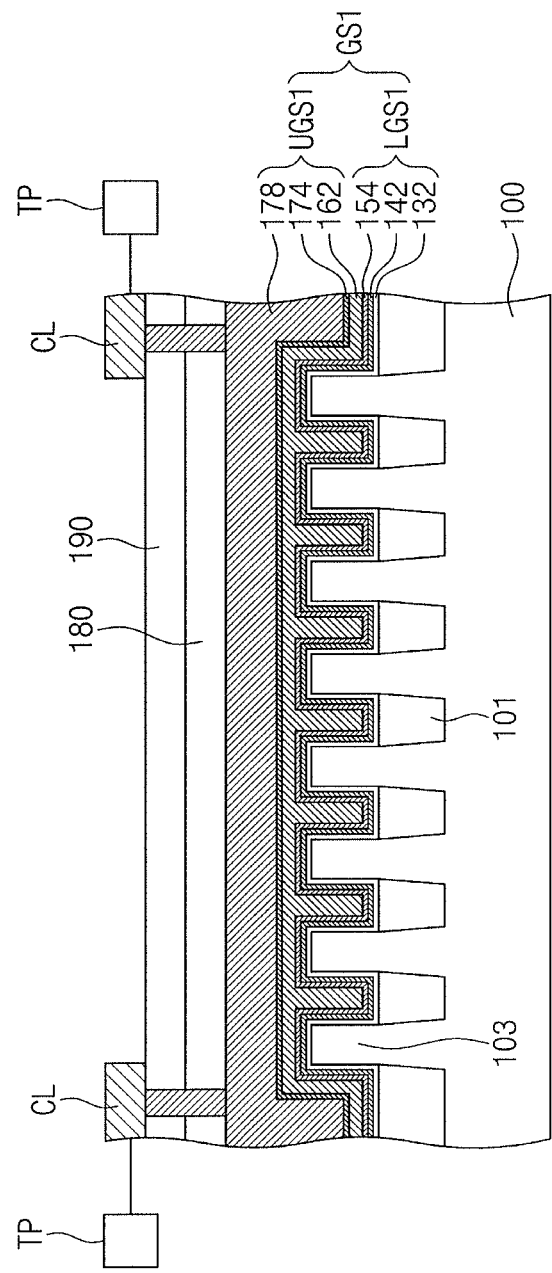
Figure 6A:
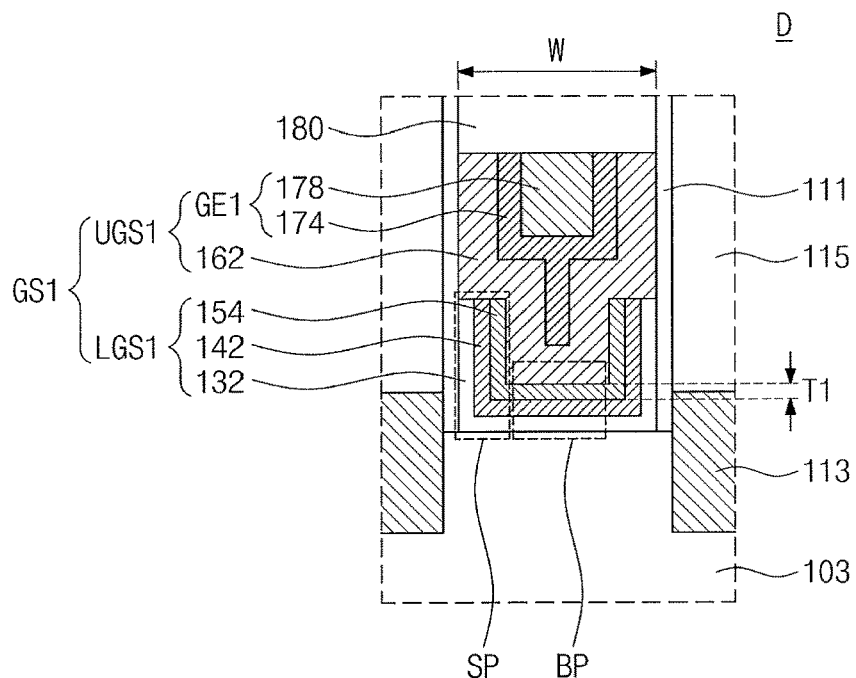
FIGS. 6A and 6C illustrate enlarged views of section D shown in FIG. 5A.
Figure 6B:
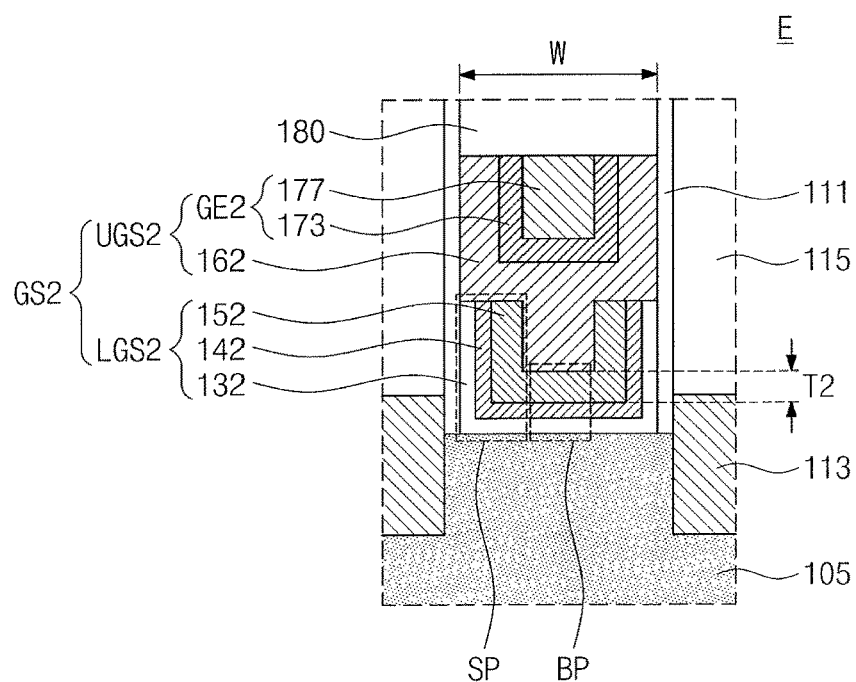
FIG. 6B illustrates an enlarged view of section E shown in FIG. 5A.
Figure 6C:
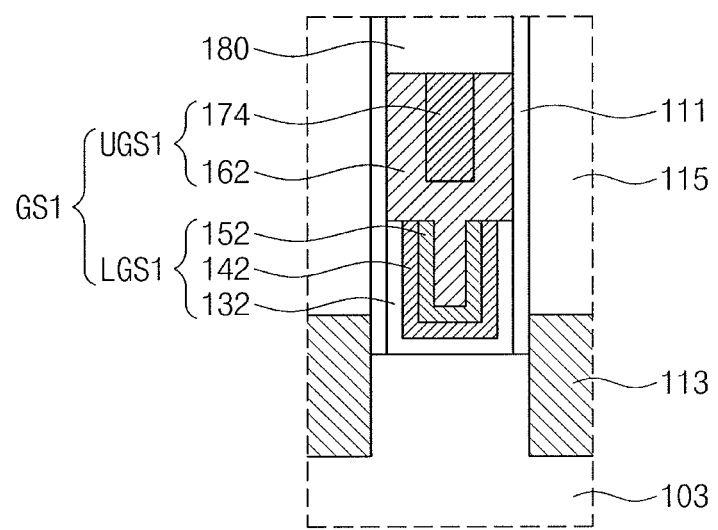

FIG. 4 illustrates an enlarged view of section C shown in FIGS. 3A and 3B. FIGS. 5A and 5B illustrate cross-sectional views taken along lines I-I' and II-II' of FIG. 4, respectively. FIGS. 6A and 6C illustrate enlarged views of section D shown in FIG. 5A, and FIG. 6B illustrates an enlarged view of section E shown in FIG. 5A.

Referring to FIGS. 4, 5A, and 5B, a semiconductor substrate 100 may include first regions R1 and second regions R2. One of the first regions R1 may be provided between the second regions R2 adjacent to each other (e.g., between adjacent second regions R2).

In an implementation, the first regions R1 may be regions on which the first test blocks (see TB1 of FIGS. 3A and 3B) are formed, and the second regions R2 may be regions on which the second test blocks (see TB2 of FIGS. 3A and 3B) are formed. For example, the first transistors may be provided on the first regions R1 and the second transistors may be provided on the second regions R2. The first and second transistors may have different threshold voltages from each other.

In an implementation, the first transistors may be NMOS transistors having a first threshold voltage, and the second transistors may be PMOS transistors having a second threshold voltage. In an implementation, the first and second transistors may be NMOS or PMOS transistors having different threshold voltages from each other.

For example, first active patterns 103 may protrude from the semiconductor substrate 100 in the first regions R1 and may extend in parallel to each other in the first direction D1. Second active patterns 105 may protrude from the semiconductor substrate 100 in the second regions R2 and may extend in parallel to each other in the first direction D1.

The first and second active patterns 103 and 105 may be portions of the semiconductor substrate 100 that are defined by a device isolation layer 101, whose top surface may be positioned lower than those of the first and second active patterns 103 and 105 (e.g., the top surface of the device isolation layer 101 may be closer to the semiconductor substrate 100 than top surfaces of the first and second active patterns 103 and 105). The device isolation layer 101 may separate the first and second active patterns 103 and 105 from each other.

The first transistors may include first gate structures GS1 and source/drain impurity layers 113 on opposite sides of each of the first gate structures GS1. The first gate structures GS1 may extend in the second direction D2 while extending across the first active patterns 103.

The second transistors may include second gate structures GS2 and source/drain impurity layers 113 on opposite sides of each of the second gate structures GS2. The second gate structures GS2 may extend in the second direction D2 while extending across the second active patterns 105.

Each of the first gate structures GS1 may include a first lower gate structure LGS1 and a first upper gate structure UGS1. Each of the second gate structures GS2 may include a second lower gate structure LGS2 and a second upper gate structure UGS2. Gate spacers 111 may be disposed on opposite sidewalls of each of the first and second gate structures GS1 and GS2. In an implementation, the first and second gate structures GS1 and GS2 may have a substantially uniform line width (see W of FIGS. 6A and 6B) and may extend in the second direction D2.

For example, referring to FIGS. 6A and 6B, each of the first and second lower gate structures LGS1 and LGS2 may include sidewalls SP and a bottom BP connecting the sidewalls SP. The sidewalls SP may partially cover or contact the gate spacers 111, and the bottom BP may cover or contact the first and second active patterns 103 and 105. Each of the first and second lower gate structures LSG1 and LGS2 may have a recess region defined by the sidewalls SP and the bottom BP. In an implementation, the bottom BP of the first lower gate structure LGS1 may have a thickness that is different from that of the bottom BP of the second lower gate structure LGS2. The sidewalls SP of the first lower gate structure LGS1 may have top surfaces at substantially a same level as those of the sidewalls SP of the second lower gate structure LGS2 (e.g., the top surfaces may be substantially coplanar).

Each of the first and second lower gate structures LGS1 and LGS2 may include a high-k dielectric pattern 132, a first barrier metal pattern 142, and a respective one of threshold voltage adjusting patterns 152 and 154 that are sequentially stacked.

In an implementation, the threshold voltage adjusting patterns 152 and 154 of the first and second lower gate structures LGS1 and LGS2 may be composed of a same material. The threshold voltage adjusting pattern 154 of the first lower gate structure LGS1 may have a first thickness T1, and the threshold voltage adjusting pattern 152 of the second lower gate structure LGS2 may have a second thickness T2 that is greater than the first thickness T1. For example, the threshold voltage adjusting patterns 152 and 154 may include a titanium nitride (TiN) layer or a tantalum nitride (TaN) layer. In an implementation, threshold voltages of transistors on the first and second regions R1 and R2 may be changed depending on thicknesses of the threshold voltage adjusting patterns 152 and 154.

The high-k dielectric patterns 132 of the first and second lower gate structures LGS1 and LGS2 may be composed of the same material and may have substantially the same thickness. The high-k dielectric patterns 132 may include, e.g., a high-k dielectric material whose dielectric constant is greater than that of silicon oxide.

In an implementation, the first barrier metal patterns 142 of the first and second lower gate structures LGS1 and LGS2 may be composed of the same material and may have substantially the same thickness. The first barrier metal patterns 142 may include, e.g., a titanium nitride (TiN) layer or a tantalum nitride (TaN) layer.

The first and second upper gate structures UGS1 and UGS2 may be disposed on the first and second lower gate structures LGS1 and LGS2, and may fill the recess regions of the first and second lower gate structures LGS1 and LGS2.

For example, referring to FIGS. 6A and 6B, each of the first and second upper gate structures UGS1 and UGS2 may include a work function conductive pattern 162 and a respective one of gap-fill metal patterns GE1 and GE2. In an implementation, the, the gap-fill metal patterns GE1 and GE2 of the first and second upper gate structures UGS1 and UGS2 may have top surfaces at substantially the same level (e.g., coplanar with one another). In an implementation, the, the work function conductive patterns 162 may have top surfaces at substantially the same level as those of the gap-fill metal patterns GE1 and GE2.

Each of the first and second lower gate structures LGS1 and LGS2 may include, e.g., the high-k dielectric pattern 132, the first barrier metal pattern 142, and the respective one of threshold voltage adjusting patterns 152 and 154 that are sequentially stacked.

In an implementation, the threshold voltage adjusting patterns 152 and 154 of the first and second lower gate structures LGS1 and LGS2 may be composed of the same material. The threshold voltage adjusting pattern 154 of the first lower gate structure LGS1 may have a first thickness T1, and the threshold voltage adjusting pattern 152 of the second lower gate structure LGS2 may have a second thickness T2 that is greater than the first thickness T1. In an implementation, the threshold voltage adjusting patterns 152 and 154 may include, e.g., a titanium nitride (TiN) layer or a tantalum nitride (TaN) layer. In an implementation, the threshold voltages of transistors on the first and second regions R1 and R2 may be changed depending on thicknesses of the threshold voltage adjusting patterns 152 and 154.

The high-k dielectric patterns 132 of the first and second lower gate structures LGS1 and LGS2 may be composed of the same material and may have substantially the same thickness. The high-k dielectric patterns 132 may include a high-k dielectric material whose dielectric constant is greater than that of silicon oxide.

The first barrier metal patterns 142 of the first and second lower gate structures LGS1 and LGS2 may be composed of the same material and may have substantially the same thickness. In an implementation, the first barrier metal patterns 142 may include, e.g., a titanium nitride (TiN) layer or a tantalum nitride (TaN) layer.

The first and second upper gate structures UGS1 and UGS2 may be disposed on the first and second lower gate structures LGS1 and LGS2, and may fill the recess regions of the first and second lower gate structures LGS1 and LGS2.

In an implementation, the first upper gate structure UGS1 may have a first lower width in the recess region of the first lower gate structure LGS1, and the second upper gate structure UGS2 may have a second lower width, that is less than the first lower width, in the recess region of the second lower gate structure LGS2.

For example, referring to FIGS. 6A and 6B, each of the first and second upper gate structures UGS1 and UGS2 may include the work function conductive pattern 162 and a respective one of the gap-fill metal patterns GE1 and GE2.

In an implementation, the gap-fill metal patterns GE1 and GE2 of the first and second upper gate structures UGS1 and UGS2 may have top surfaces at substantially the same level. In addition, the work function conductive patterns 162 may have top surfaces at substantially the same level as those of the gap-fill metal patterns GE1 and GE2.

The work function conductive pattern 162 may cover or contact the sidewalls SP and the bottom BP of each of the first and second lower gate structures LGS1 and LGS2. For example, the work function conductive patterns 162 may be in contact with the threshold voltage adjusting patterns 152 and 154 of the first and second lower gate structures LGS1 and LGS2. The work function conductive patterns 162 of the first and second upper gate structures UGS1 and UGS2 may have substantially the same thickness. For example, the work function conductive patterns 162 of the first and second upper gate structures UGS1 and UGS2 may be composed of the same material. In an implementation, the work function conductive patterns 162 of the first and second upper gate structures UGS1 and UGS2 may have different concentrations of a work function adjusting material (e.g., Al, Mg, Ca, Sr, V, Nb, Sc, Y, or a lanthanoid material).

The gap-fill metal pattern GE1/GE2 may include a second barrier metal pattern 174/173 and a metal pattern 178/177 on the second barrier metal pattern 174/173. The second barrier metal pattern 174/173 may be in contact with the work conductive pattern 162.

The gap-fill metal patterns GE1 and GE2 may have different shapes in the first and second upper gate structures UGS1 and UGS2.

In an implementation, the second barrier metal pattern 174 of the first upper gate structure UGS1 may have a bottom surface lower than that of the second barrier metal pattern 173 of the second upper gate structure UGS2 (e.g., the bottom surface of the second barrier metal pattern 174 of the first upper gate structure UGS1 may be closer to the semiconductor substrate 100 than the bottom surface of the second barrier metal pattern 173 of the second upper gate structure UGS2).

In an implementation, when the first and second gate structures GS1 and GS2 have a reduced line width W, as shown in FIG. 6C, the gap-fill metal pattern GE1 of the first upper gate structure UGS1 may be composed of the second barrier metal pattern 174, e.g., without the metal pattern.

The second barrier metal patterns 174 and 173 of the first and second upper gate structures UGS1 and UGS2 may include the same conductive material, and the metal patterns 178 and 177 of the first and second upper gate structures UGS1 and UGS2 may have the same metallic material.

In an implementation, the second barrier metal patterns 173 and 174 may include conductive metal nitride (e.g., titanium nitride, tantalum nitride, and/or tungsten nitride), and the metal patterns 177 and 178 may include metal (e.g., tungsten, aluminum, titanium, and/or tantalum).

In an implementation, an interlayer dielectric layer 115 may fill between the first gate structures GS1 and/or between the second gate structures GS2. In an implementation, the first and second gate structures GS1 and GS2 may have top surfaces at substantially the same level as or lower than that of the interlayer dielectric layer 115.

Capping insulation patterns 180 may be disposed on the first and second gate structures GS1 and GS2. The capping insulation patterns 180 may have top surfaces substantially coplanar with that of the interlayer dielectric layer 115.

In an implementation, one of a plurality of the first gate structures GS1 may have opposite ends connected through a connecting line CL to a test pad TP. A current source may be connected to the first gate structure GS1 via the test pads TP and then a voltage across the first gate structure GS1 may be measured to estimate resistance of the first gate structure GS1. It may be possible to evaluate changes of the line width W of the first gate structure GS1 and also to evaluate for an electrical short between the first gate structure GS1 and the first active pattern 103.

FIGS. 7A to 7J illustrate cross sectional views taken along line I-I' of FIG. 4 and show stages in a method of fabricating a semiconductor device according to exemplary embodiments.

Figure 7A:
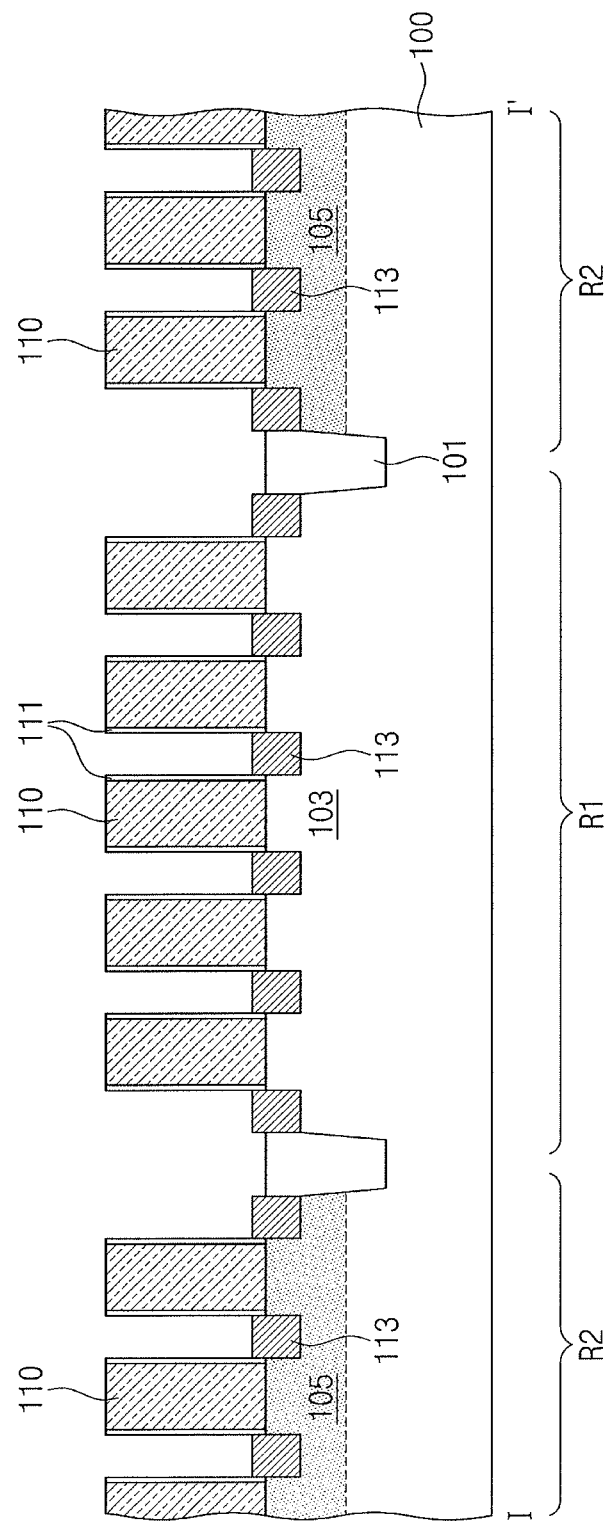
FIGS. 7A to 7J illustrate cross sectional views taken along line I-I' of FIG. 4, showing stages in a method of fabricating a semiconductor device according to exemplary embodiments.

Referring to FIG. 7A, a semiconductor substrate 100 may include first regions R1 and second regions R2. One of the first regions R1 may be provided between adjacent second regions R2.

The semiconductor substrate 100 may be patterned to form first active patterns 103 on the first region R1 and extending in a first direction D1 and also to form second active patterns 105 on the second region R2 and extending in the first direction D1.

A device isolation layer 101 may be formed between the first and second active patterns 103 and 105, and may partially expose a top surface and opposite sidewalls of each of the first and second active patterns 103 and 105.

Sacrificial gate patterns 110 may be formed to have substantially the same line width while extending across the first and second active patterns 103 and 105, and gate spacers 111 may be formed on opposite sidewalls of each of the sacrificial gate patterns 110.

The gate spacers 111 may be formed of an insulating material (e.g., metal oxide, silicon oxide, silicon nitride, silicon oxynitride, or a combination thereof) having an etch selectivity to the sacrificial gate patterns 110.

In an implementation, the sacrificial gate patterns 110 may have substantially the same line width and may extend in a second direction D2.

Source/drain impurity layers 113 may be formed on the first and second active patterns 103 and 105 on opposite sides of each of the sacrificial gate patterns 110. The source/drain impurity layers 113 may be epitaxial layers grown from the semiconductor substrate 100.

In an implementation, when NMOS transistors are formed on the first region R1 and PMOS transistors are formed on the second region R2, the epitaxial layers on the first region R1 may include a semiconductor material having a lattice constant that is different from that of a semiconductor material included in the epitaxial layers on the second region R2. For example, the source/drain impurity layers 113 on the first region R1 may be a silicon carbide (SiC) epitaxial layer, and the source/drain impurity layers 113 on the second region R2 may be a silicon germanium (SiGe) epitaxial layer.

In an implementation, when NMOS transistors with different threshold voltages are formed on the first and second regions R1 and R2, the source/drain impurity layers 113 may include a semiconductor material having the same lattice constant on the first and second regions R1 and R2.

Figure 7B:
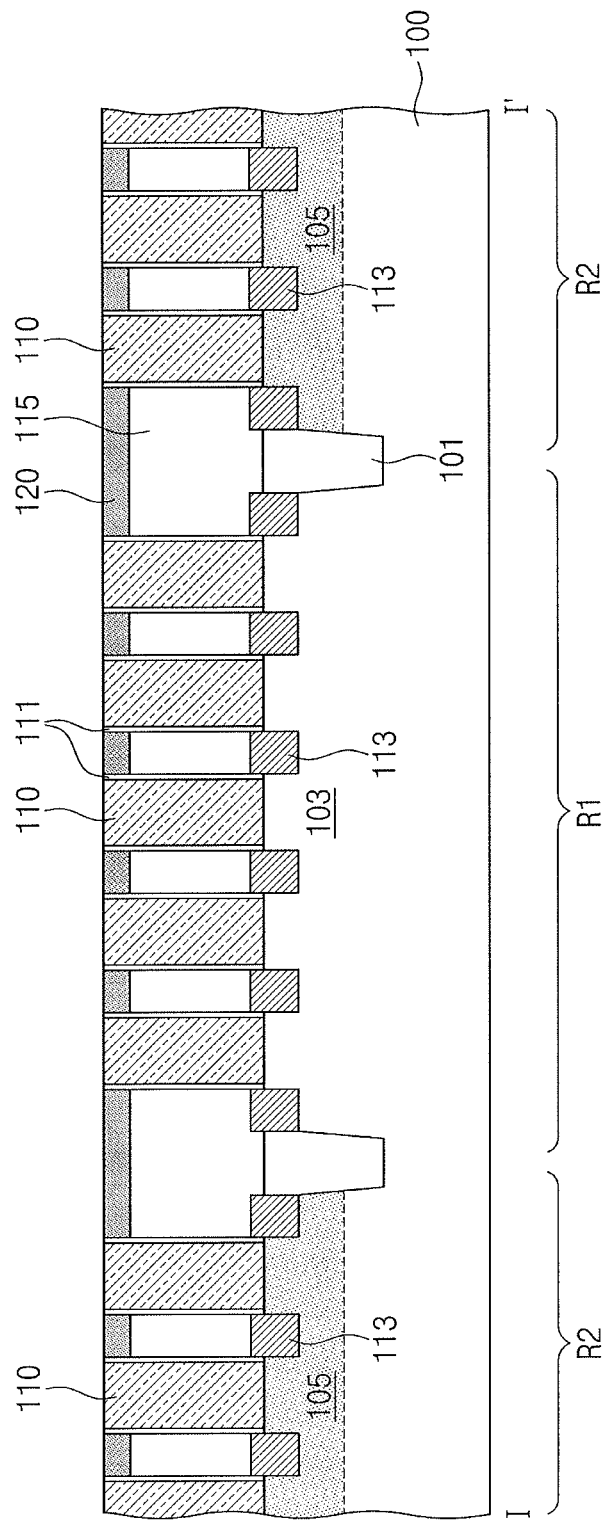

Referring to FIG. 7B, the semiconductor substrate 100 may be provided thereon with an interlayer dielectric layer 115 that covers the sacrificial gate patterns 110.

The interlayer dielectric layer 115 may be formed by depositing an insulation layer to fill between the sacrificial gate patterns 110 and also to cover top surfaces of the sacrificial gate patterns 110 and then performing a planarization process until the top surfaces of the sacrificial gate patterns 110 is exposed. The planarization process may use, e.g., a chemical mechanical polishing (CMP) process or an anisotropic etching process. The interlayer dielectric layer 115 may be formed of an insulating material having an etch selectivity to the gate spacers 111. In an implementation, the insulating material may include, e.g., one or more of a silicon oxide layer, a silicon nitride layer, a silicon oxynitride layer, and a low-k dielectric layer.

After performing the planarization process on the interlayer dielectric layer 115, an anisotropic etching process may be performed such that the interlayer dielectric layer 115 may have a top surface recessed below the top surfaces of the sacrificial gate patterns 110.

Subsequently, an etch stop layer 120 may be formed on the recessed interlayer dielectric layer 115. The etch stop layer 120 may be formed of an insulating material having an etch selectivity to the sacrificial gate patterns 110 and the interlayer dielectric layer 115. For example, the etch stop layer 120 may include a silicon nitride layer or a silicon oxynitride layer.

The etch stop layer 120 may be formed by depositing an insulation layer to cover the interlayer dielectric layer 115 and the sacrificial gate patterns 110 and then performing a planarization process until the top surfaces of the sacrificial gate patterns 110 are exposed.

The planarization process may cause the etch stop layer 120 to have a top surface at substantially the same level as those of the sacrificial gate patterns 110. For example, the top surface of the etch stop layer 120 may be substantially coplanar with those of the sacrificial gate patterns 110.

Figure 7C:
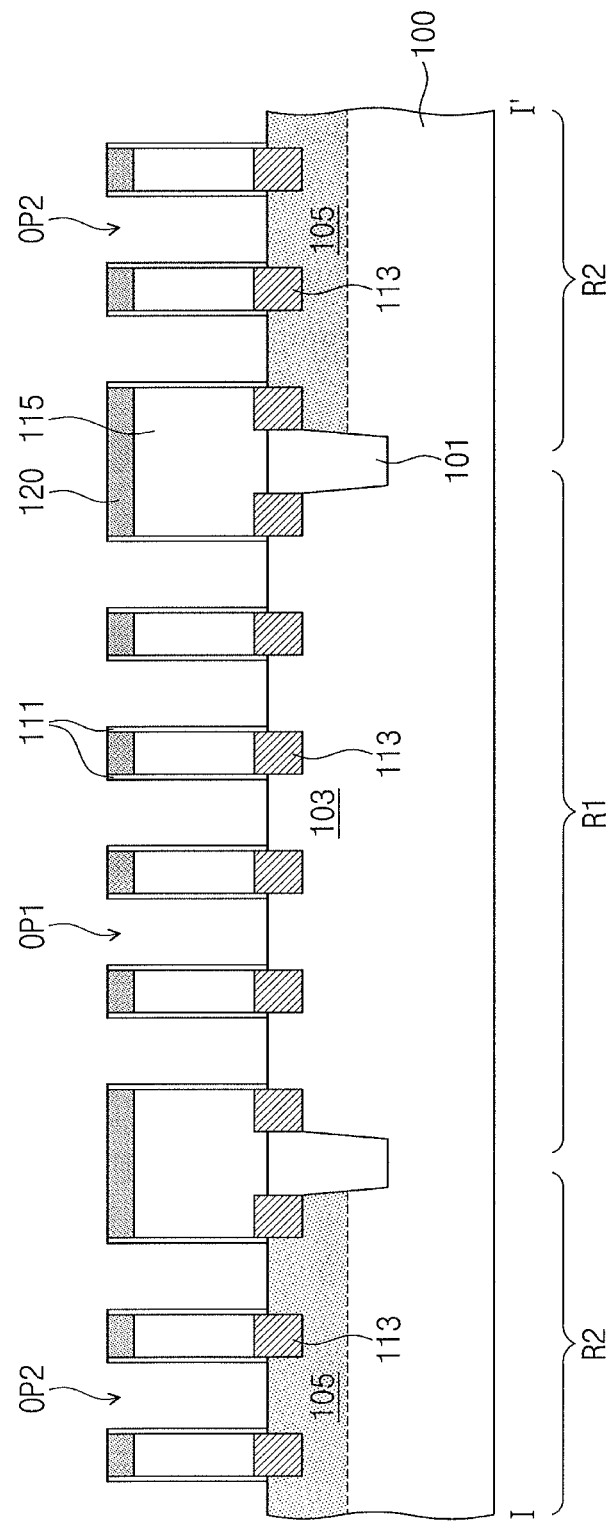

Referring to FIG. 7C, first and second openings OP1 and OP2 may be formed by selectively removing the sacrificial gate patterns 110 exposed through the etch stop layer 120. In an implementation, the first and second openings OP1 and OP2 may have substantially the same line width and may extend in the second direction D2.

On the first region R1, the first openings OP1 may extend across the first active patterns 103 and may partially expose the first active patterns 103. On the second region R2, the second openings OP2 may extend across the second active patterns 105 and may partially expose the second active patterns 105.

Figure 7D:
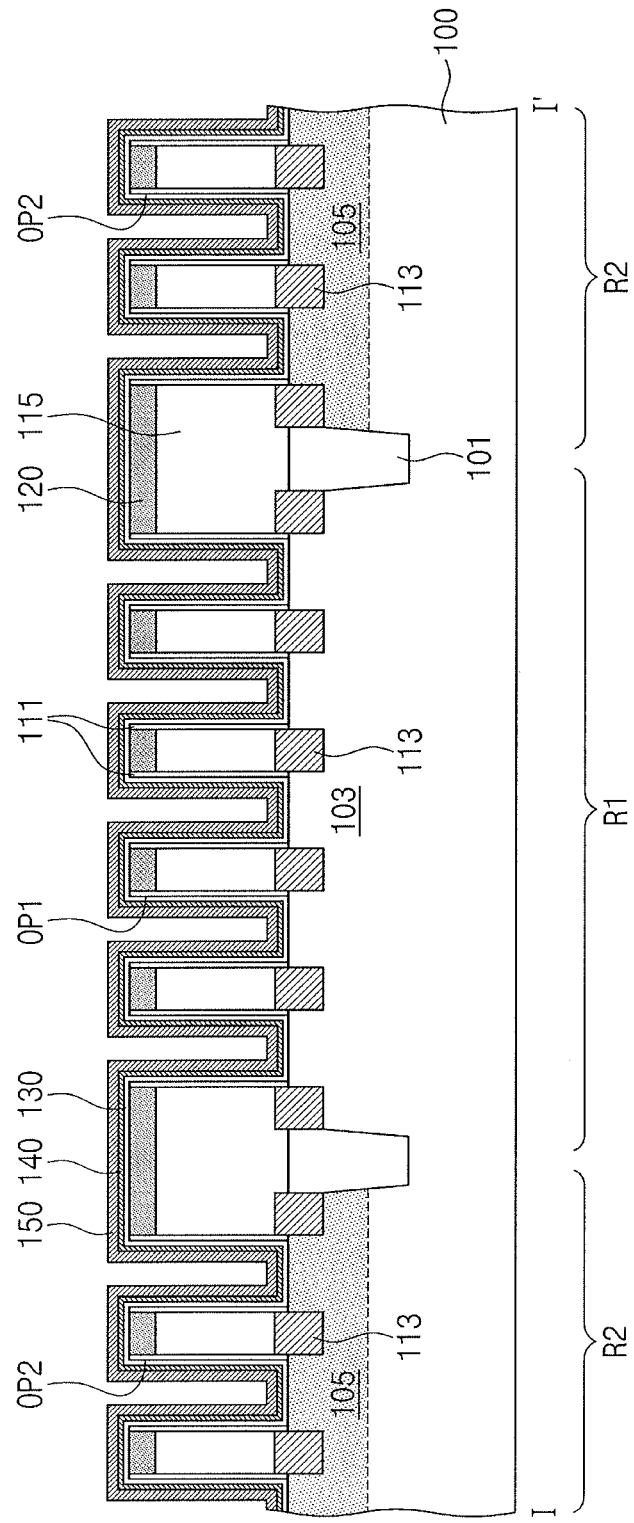

Referring to FIG. 7D, a high-k dielectric layer 130, a first bather metal layer 140, and a threshold voltage adjusting layer 150 may be sequentially deposited to conformally cover inner sidewalls of the first and second openings OP1 and OP2.

The high-k dielectric layer 130, the first barrier metal layer 140, and the threshold voltage adjusting layer 150 may be formed to have substantially the same thickness on the first and second regions R1 and R2. The high-k dielectric layer 130, the first barrier metal layer 140, and the threshold voltage adjusting layer 150 may be formed by performing, e.g., an atomic layer deposition (ALD) or chemical vapor deposition (CVD) process.

The high-k dielectric layer 130 may include, e.g., a metal oxide, metal silicate, or metal silicate nitride. In an implementation, the metal oxide may include oxide containing metal such as hafnium (Hf), aluminum (Al), lanthanum (La), or zirconium (Zr). For example, the metal oxide may include $HfO_2$, $Al_2O_3$, $La_2O_3$, $ZrO_2$, or a combination thereof. In an implementation, the metal silicate may include silicate containing metal such as hafnium (Hf) or zirconium (Zr). For example, the metal silicate may include hafnium silicate (HfSiO), zirconium silicate (ZrSiO), or a combination thereof. In an implementation, the metal silicate nitride may include silicate containing metal such as hafnium (Hf) or zirconium (Zr). For example, the metal silicate nitride may include hafnium silicate nitride (HfSiON), zirconium silicate nitride (ZrSiON), or a combination thereof.

In an implementation, the first barrier metal layer 140 may include metal nitride or metal selected from Ti, Ta, W, Ru, Nb, Mo, and Hf. The first barrier metal layer 140 may be composed of a single layer or two or more multi-layer. In an implementation, the threshold voltage adjusting layer 150 may be formed of a tantalum nitride (TaN) layer.

Field effect transistors may be adjusted on their threshold voltages based on a thickness of the threshold voltage adjusting layer 150. In an implementation, the threshold voltage adjusting layer 150 may be deposited to a first thickness on the first and second regions R1 and R2.

The threshold voltage adjusting layer 150 may be formed of, e.g., titanium, tantalum, titanium nitride, tantalum nitride, titanium silicide, tantalum silicide, titanium carbide, tantalum carbide, titanium silicon nitride, tantalum silicon nitride, titanium silicon carbide, or tantalum silicon carbide. In an implementation, the threshold voltage adjusting layer 150 may be formed of a titanium nitride (TiN) layer.

Thereafter, a sacrificial layer may be formed to fill the first and second openings OP1 and OP2 including the threshold voltage adjusting layer 150 formed therein. The sacrificial layer may be formed of a material having superior gap-fill characteristics and having an etch selectivity to the threshold voltage adjusting layer 150.

After the sacrificial layer is formed, a planarization process may be performed until the etch stop layer 120 is exposed. The sacrificial layer may be formed of, e.g., C—SOH (carbon based spin-on hardmask), S—SOH (silicon based spin-on hardmask), or BARC (Bottom Anti Reflective Coating). The planarization process may use a chemical mechanical polishing (CMP) process.

Figure 7E:
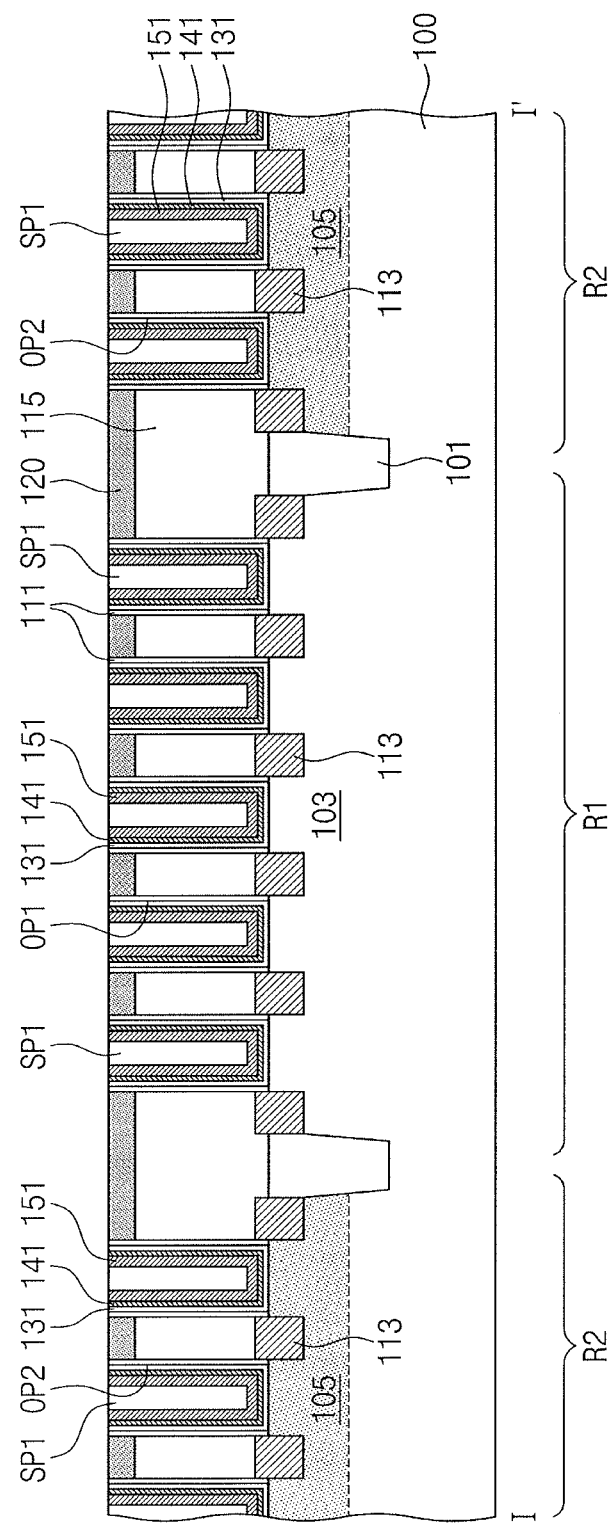

The planarization process may form, as shown in FIG. 7E, a high-k dielectric pattern 131, a first barrier metal pattern 141, a first threshold voltage adjusting pattern 151, and a first sacrificial pattern SP1 in each of the first and second openings OP1 and OP2. In this step, the first threshold voltage adjusting pattern 151 may have a first thickness.

Figure 7F:
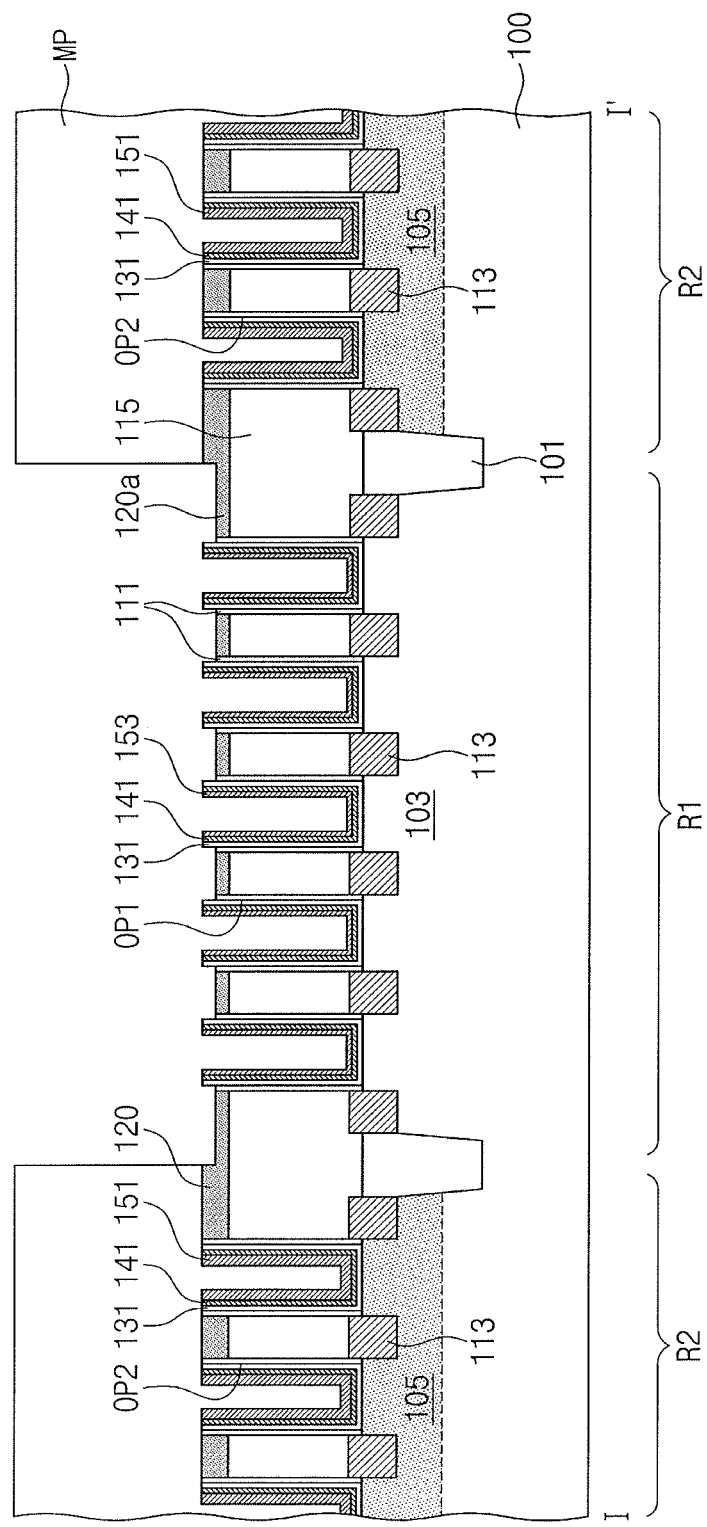

Referring to FIG. 7F, a mask pattern MP may be formed to expose the first region R1.

In an implementation, the mask pattern MP may be formed of the same material as that of the first sacrificial pattern SP1. In an implementation, the mask pattern MP may be formed of, e.g., C—SOH (carbon based spin-on hardmask), S—SOH (silicon based spin-on hardmask), or BARC (Bottom Anti Reflective Coating).

When the mask pattern MP is formed, the first sacrificial patterns SP1 may be removed from the first region R1 and the first threshold voltage adjusting pattern 151 may be exposed in or at the first openings OP1.

The mask pattern MP may be used as an etch mask to partially etch the first threshold voltage adjusting pattern 151 in the first openings OP1, and thus the first threshold voltage adjusting pattern 151 may have a reduced thickness. The first threshold voltage adjusting pattern 151 may be reduced in its thickness by an isotropic etching process. Accordingly, the first openings OP1 may be provided therein with second threshold voltage adjusting patterns 153 that are formed to have a second thickness that is less than the first thickness.

In an implementation, when an etch process is performed on the first threshold voltage adjusting patterns 151 on the first region R1, a recessing may be performed on a portion of the etch stop layer 120 exposed through the mask pattern MP. The recessed etch stop layer 120a on the first region R1 may have a thickness that is less than a thickness of the etch stop layer 120 on the second region R2.

After the second threshold voltage adjusting patterns 153 are formed on the first region R1, the mask pattern MP may be removed.

Figure 7G:
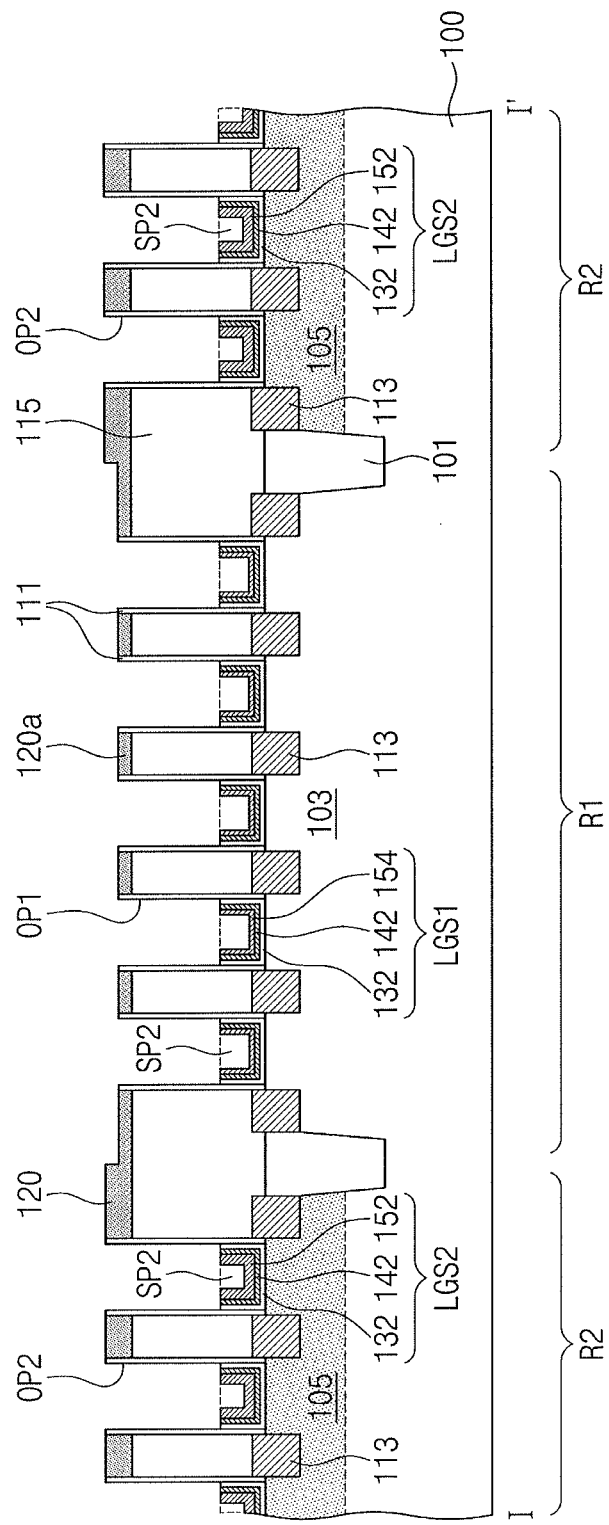

Referring to FIG. 7G, first lower gate structures LGS1 may be formed in corresponding first openings OP1, and second lower gate structures LGS2 may be formed in corresponding second openings OP2.

For example, after the second threshold voltage adjusting patterns 153 are formed on the first region R1, second sacrificial patterns SP2 may be formed to partially fill the first and second openings OP1 and OP2 including the first and second threshold voltage adjusting patterns 151 and 153 formed therein. In this step, the second sacrificial patterns SP2 may have top surfaces lower than a top surface of the interlayer dielectric layer 115 (e.g., top surfaces of the second sacrificial patterns SP2 may be closer to the semiconductor substrate 100 than the top surface of the interlayer dielectric layer 115).

The first and second lower gate structures LGS1 and LGS2 may be formed by sequentially etching upper portions of the high-k dielectric pattern 131, the first barrier metal pattern 141, the first threshold voltage adjusting pattern 151, and the second threshold voltage adjusting pattern 153 that are exposed through the second sacrificial patterns SP2.

The first and second lower gate structures LGS1 and LGS2 may have a substantially U-shaped cross-section. For example, each of the first and second lower gate structures LGS1 and LGS2 may include sidewalls formed on inner sidewalls of the gate spacers 111 and a bottom formed on a respective one of the first and second active patterns 103 and 105. The bottom may connect the corresponding sidewalls to each other.

After the first and second lower gate structures LGS1 and LGS2 are formed, the second sacrificial patterns SP2 may be removed from the first and second openings OP1 and OP2.

Figure 7H:
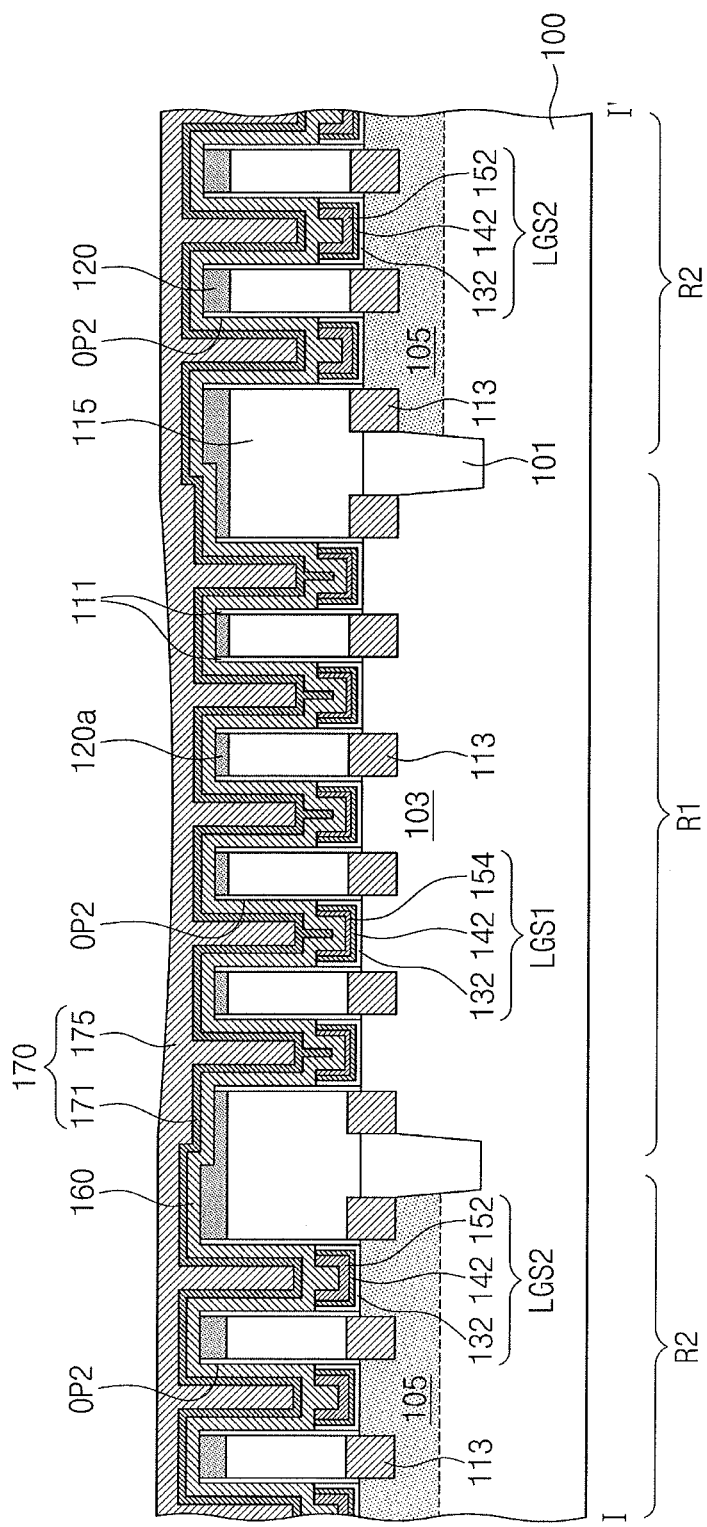

Referring to FIG. 7H, a work function conductive layer 160 and a gap-fill metal layer 170 may be formed in the first and second openings OP1 and OP2 including the first and second lower gate structures LGS1 and LGS2 formed therein.

An ALD or CVD process may be used to deposit the work function conductive layer 160 to a uniform thickness in the first and second openings OP1 and OP2. The work function conductive layer 160 may be formed of a conductive material having a predetermined work function. In an implementation, the work function conductive layer 160 may determine a work function of n- or p-typed transistors. A work function of the work function conductive layer 160 may be substantially same or different on the first and second regions R1 and R2.

In an implementation, the work function conductive layer 160 may be formed of a conductor including Al, Mg, Ca, Sr, V, Nb, Sc, Y, or a lanthanoid material. In an implementation, the work function conductive layer 160 may be formed of a conductive material including aluminum (Al). In an implementation, the work function conductive layer 160 may be formed of, e.g., metal aluminide, metal aluminum carbide, metal aluminum nitride, or metal aluminum silicide. In an implementation, the work function conductive layer 160 may include TiAlC.

The gap-fill metal layer 170 may include a second barrier metal layer 171 and a metal layer 173 that are sequentially stacked.

The second barrier metal layer 171 may be deposited to a uniform thickness in the first and second openings OP1 and OP2 in which the work function conductive layer 160 is formed. When the first and second openings OP1 and OP2 have a small line width, as discussed with reference to FIG. 6C, the second barrier metal layer 171 may completely fill the first and second openings OP1 and OP2.

In an implementation, the second barrier metal layer 171 may be formed of metal nitride, e.g., titanium nitride, tantalum nitride, tungsten nitride, hafnium nitride, or zirconium nitride.

The metal layer 173 may be formed to completely fill the first and second openings OP1 and OP2 in which the second barrier metal layer 171 is formed. When the first and second openings OP1 and OP2 have a small line width, no metal layer 173 may fill the first and second openings OP1 and OP2.

The metal layer 173 may be formed of a material having resistivity less than that of the second barrier metal layer 171. In an implementation, the metal layer 173 may be formed of, e.g., tungsten, copper, hafnium, zirconium, titanium, tantalum, aluminum, ruthenium, palladium, platinum, cobalt, nickel, conductive metal nitride, or a combination thereof.

Figure 7I:
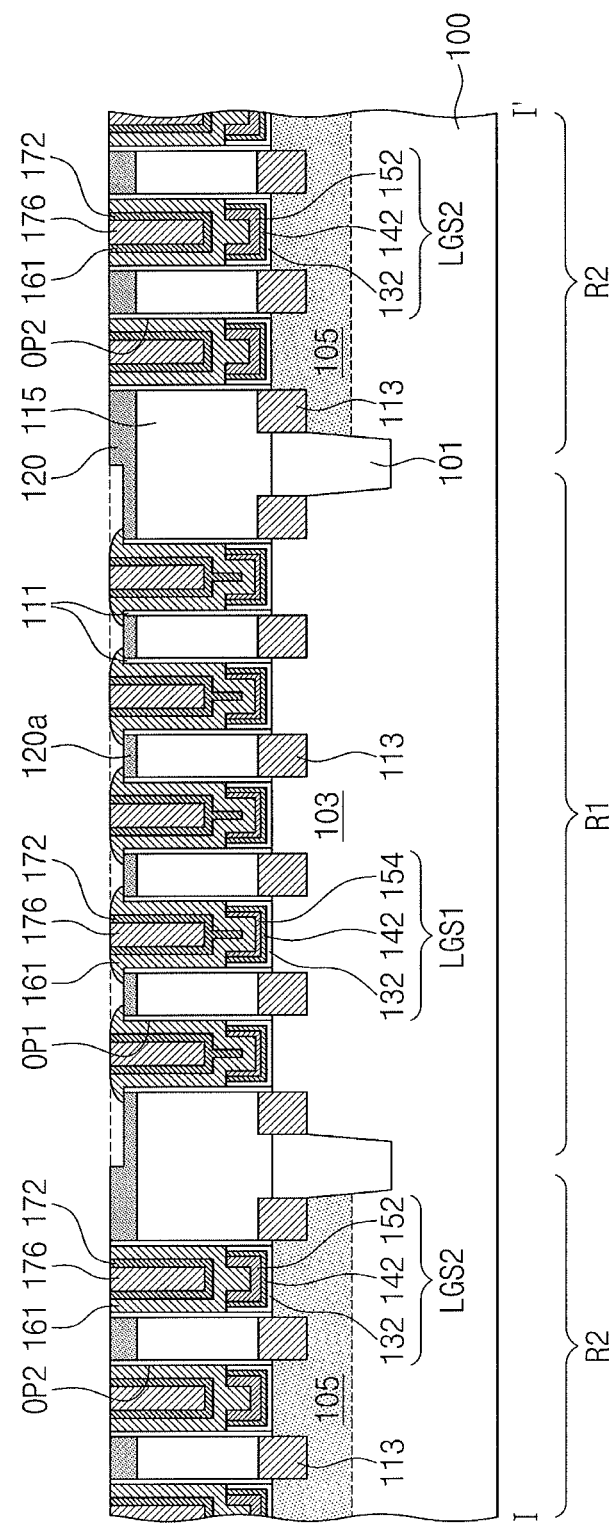

Referring to FIG. 7I, a planarization process may be performed on the work function metal layer 160 and the gap-fill metal layer 170 to expose the etch stop layer 120 on the second regions R2. In an implementation, the planarization process may use a blanket isotropic etching process and/or a chemical mechanical polishing (CMP) process.

The planarization process may form work function conductive patterns 161 and gap-fill metal patterns 172 and 176 in the first and second openings OP1 and OP2.

In an implementation, as the second regions R2 are disposed around the first region R1, a top surface of the etch stop layer 120 on the second regions R2 may be used as a polishing end point when a CMP process is performed on an entire surface of the semiconductor substrate 100.

In the planarization process, as the etch stop layer 120a has a smaller thickness on the first region R1 than in the second regions R2, upper portions of the work function conductive patterns 161 and the gap-fill metal patterns 172 and 176 may protrude or extend over a top surface of the etch stop layer 120a on the first region R1. In addition, a portion of the work function conductive layer 160 may remain on the etch stop layer 120a on the first region R1. The gap-fill metal patterns 172 and 176 may have planarized top surfaces substantially coplanar with each other on the first and second regions R1 and R2.

For example, on the first and second regions R1 and R2, a substantially uniform distance may be achieved between the top surfaces of the first and second active patterns 103 and 105 and the top surfaces of the gap-fill metal patterns 172 and 176.

Figure 7J:
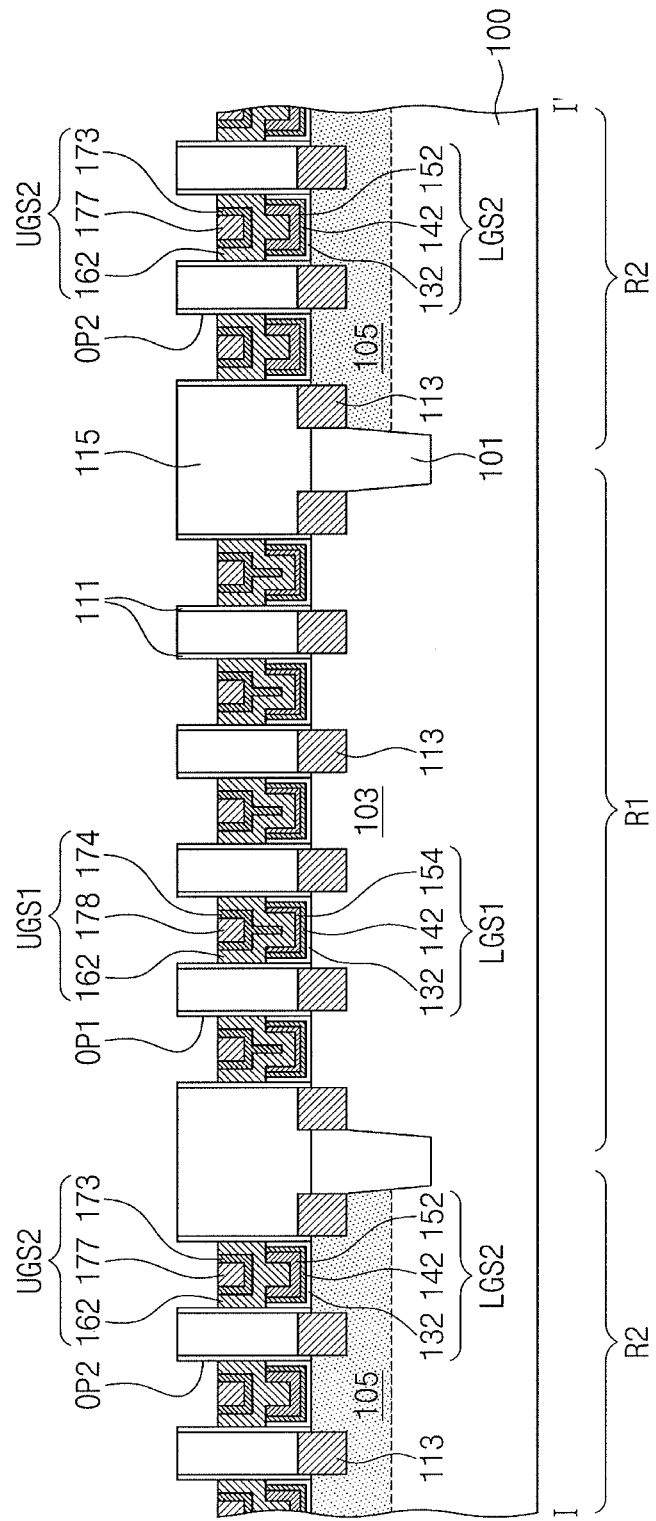

Referring to FIG. 7J, the gate spacers 111 may be partially exposed by recessing top surfaces of the work function conductive pattern 161 and the gap-fill metal patterns 172 and 176 formed in the first and second openings OP1 and OP2.

Therefore, first upper gate structures UGS1 may be formed in corresponding first openings OP1, and second upper gate structures UGS2 may be formed in corresponding second openings OP2. Herein, the first and second upper gate structures UGS1 and UGS2 may have top surfaces lower than that of the interlayer dielectric layer 115 (e.g., top surfaces of the first and second upper gate structures UGS1 and UGS2 may be closer to the semiconductor substrate 100 than the top surface of the interlayer dielectric layer 115).

For example, an isotropic etching process may be performed to recess top surfaces of the work function conductive pattern 161a and the gap-fill metal patterns 172 and 176. In this step, as the top surfaces of the work function conductive pattern 161 and the gap-fill metal patterns 172 and 176 may be positioned at the same level, the recessed top surfaces may also be positioned at the same level.

Next, as shown in FIGS. 5A and 5B, capping insulation patterns 180 may be formed to fill the first and second openings OP1 and OP2 in which the first and second upper gate structures UGS1 and UGS2 are formed.

Figure 8:
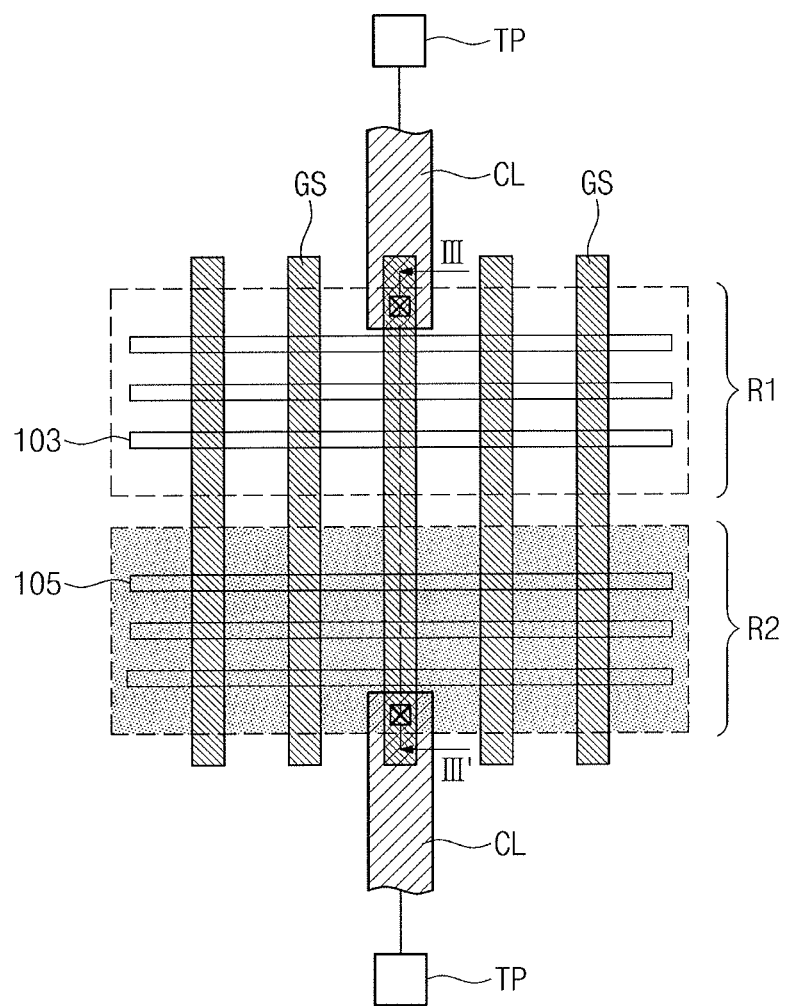
FIG. 8 illustrates a plan view of a target test block of a semiconductor device according to exemplary embodiments.
Figure 9:
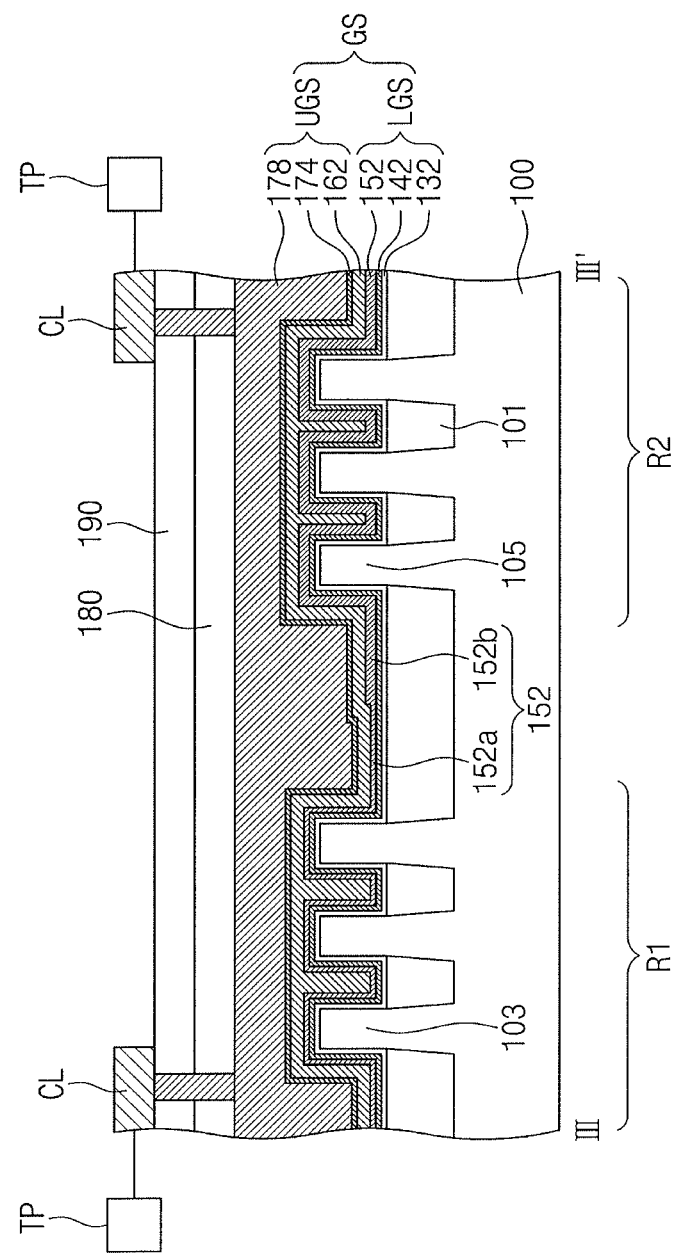
FIG. 9 illustrates a cross-sectional view taken along line III-III' of FIG. 8.

FIG. 8 illustrates a plan view of a target test block of a semiconductor device according to exemplary embodiments. FIG. 9 illustrates a cross-sectional view taken along line III-III' of FIG. 8. For brevity of the description, a repeated explanation of technical features the same as those of the embodiments discussed above may be omitted.

Referring to FIGS. 8 and 9, in the target test block (see the hatched TB1 of FIGS. 3A and 3B) for evaluating electrical characteristics of a semiconductor device, the semiconductor substrate 100 may include the first region R1 and the second region R2 adjacent to the first region R1.

On the first region R1, the first active patterns 103 may be spaced apart from each other in the second direction D2 at a first distance. On the second region R2, the second active patterns 105 may be spaced apart from each other in the second direction D2 at a first interval. The first and second active patterns 103 and 105 adjacent to each other may be spaced apart in the second direction D2 at a second distance greater than the first interval.

The device isolation layer 101 may be disposed between the first and second active patterns 103 and 105, and may have a top surface lower than those of the first and second active patterns 103 and 105.

The gate structures GS may extend in the second direction D2 while extending across the first and second active patterns 103 and 105. Each of the gate structures GS may include a lower gate structure LGS and an upper gate structure UGS.

In the present embodiment, each of the gate structures GS may include the threshold voltage adjusting pattern 152 whose thickness on the first region R1 is different from that on the second region R2.

The lower gate structure LGS may include the high-k dielectric pattern 132, the first barrier metal pattern 142, and the threshold voltage adjusting pattern 152. The high-k dielectric pattern 132 and the first barrier metal pattern 142 may have substantially the same thickness on the first and second regions R1 and R2. In an implementation, the threshold voltage adjusting pattern 152 may extend in the second direction D2, and may have different thicknesses on the first and second regions R1 and R2. For example, the threshold voltage adjusting pattern 152 may include a first segment 152a extending across the first active patterns 103 and a second segment 152b extending across the second active patterns 105, and the first segment 152a may have a thickness that is less than that of the second segment 152b. A boundary between the first and second segments 152a and 152b of the threshold voltage adjusting pattern 152 may be located between the first and second active patterns 103 and 105.

The upper gate structure UGS may include the work function conductive pattern 162 and the gap-fill metal pattern 174/178. The gap-fill metal pattern 174/178 may include the second barrier metal pattern 174 and the metal pattern 178. The gap-fill metal pattern 174/178 may have top surfaces substantially coplanar with each other on the first and second regions R1 and R2.

The first and second regions R1 and R2 may be disposed adjacent to each other, and dishing may be prevented from being occurred locally on the first region R1 when the gap-fill metal pattern 174/178 is formed. The gate structures GS may therefore be formed to have a substantially uniform height.

In an implementation, the test pads TP may be connected to opposite ends of one of the gate structures GS. A current source may be connected to the gate structure GS via the test pads TP, and then a voltage across the gate structure GS may be measured to evaluate electrical characteristics of the gate structure GS.

Figure 10:
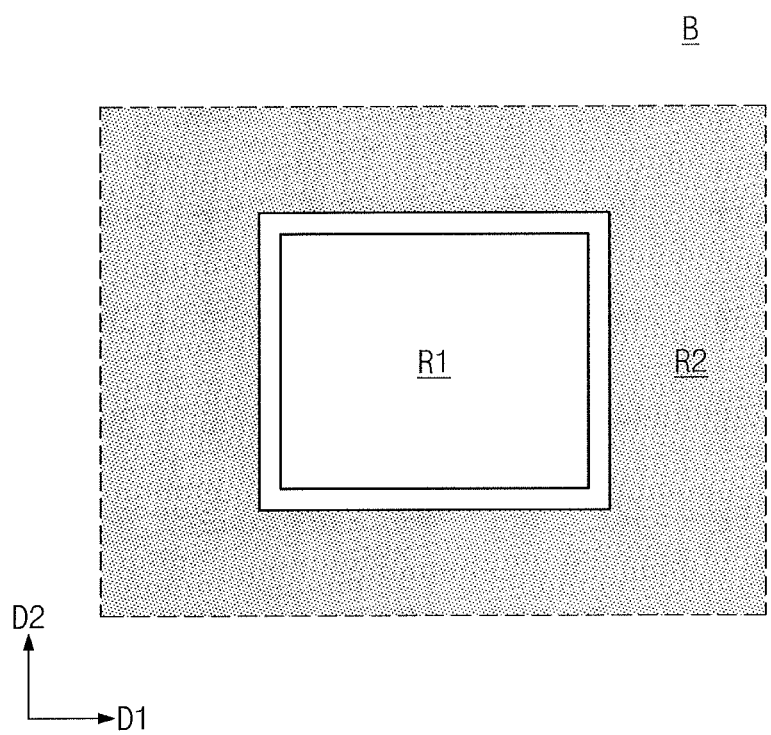
FIG. 10 illustrates an enlarged view of section B, or a portion of a chip region, shown in FIG. 1.
Figure 11:
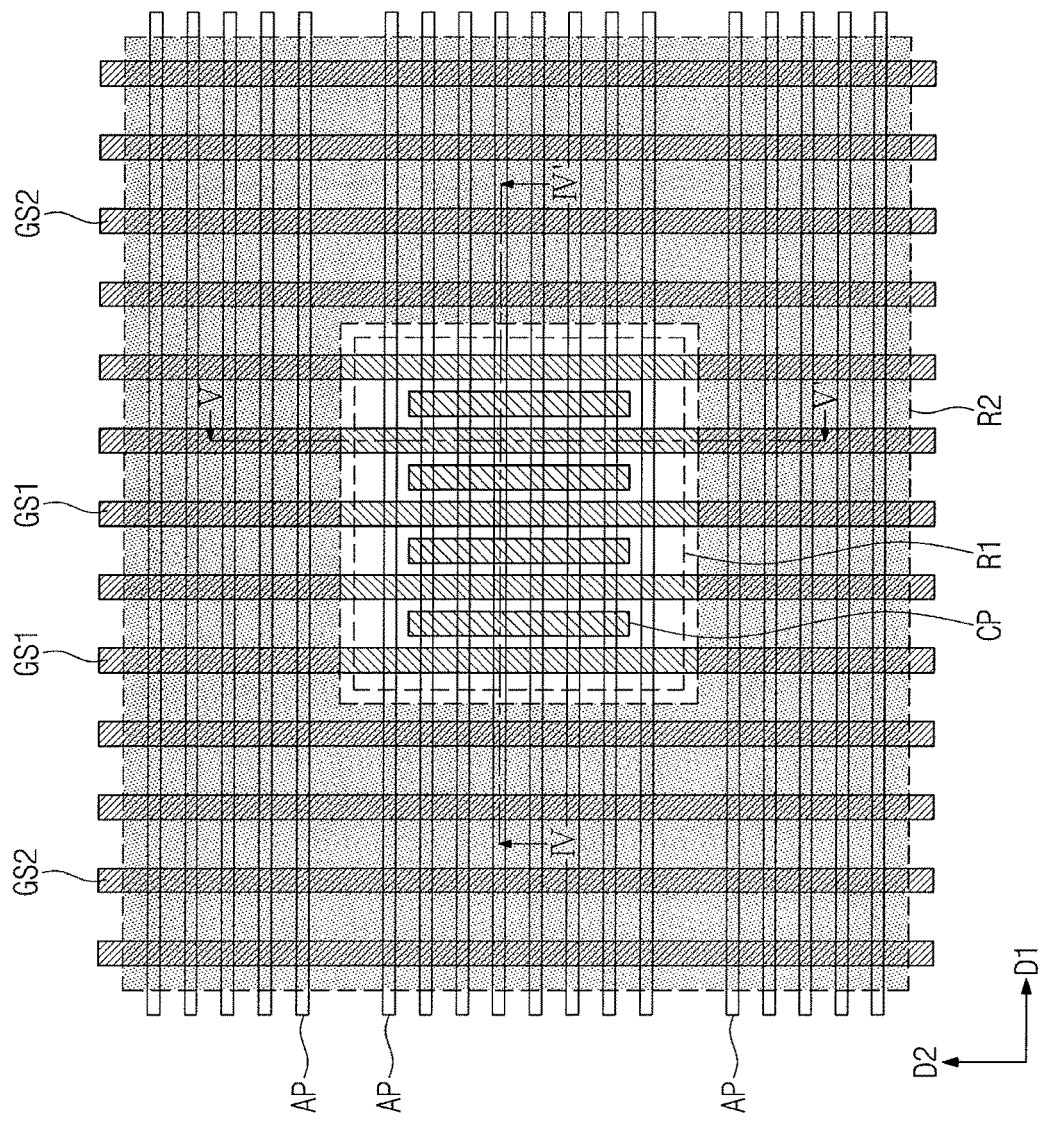
FIG. 11 illustrates a plan view showing more detail of the semiconductor device shown in FIG. 10.
Figure 12A:
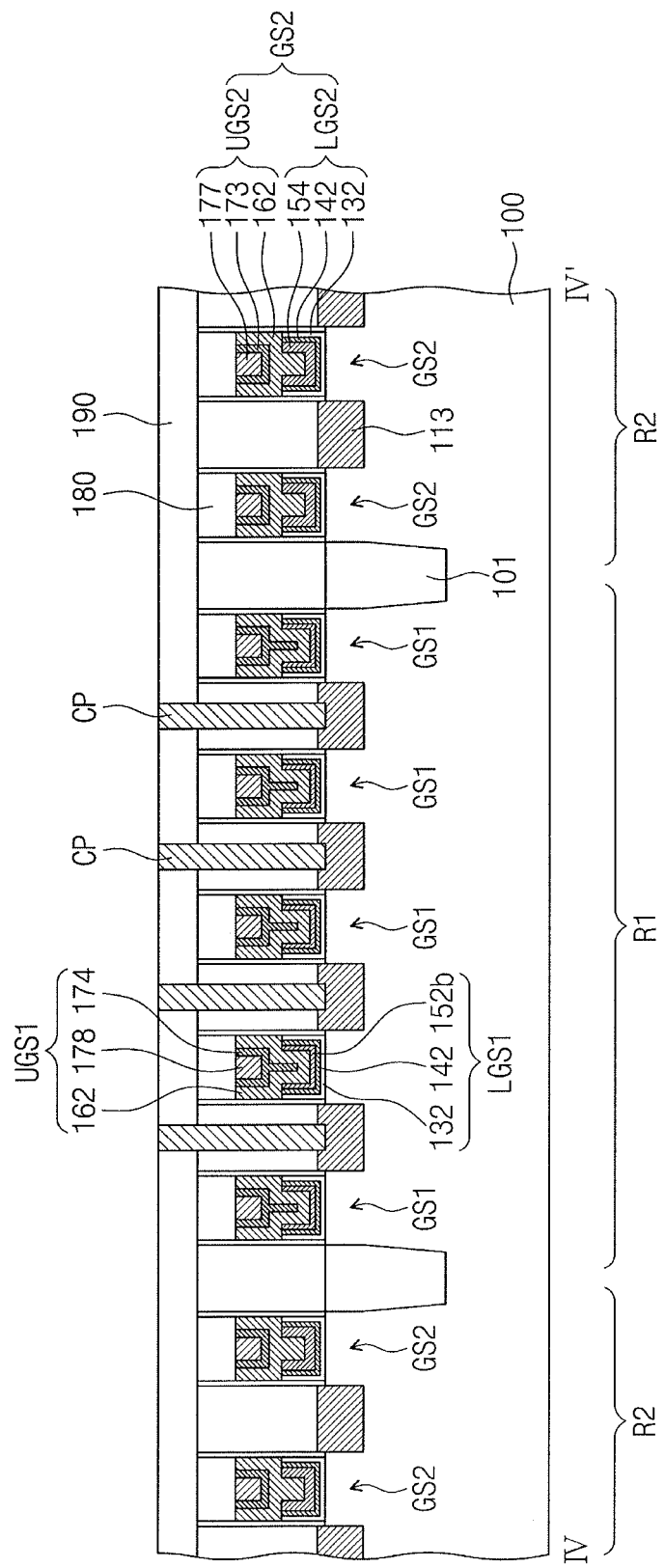
FIGS. 12A and 12B illustrate cross-sectional views taken along lines IV-IV' and V-V' of FIG. 11, respectively.
Figure 12B:
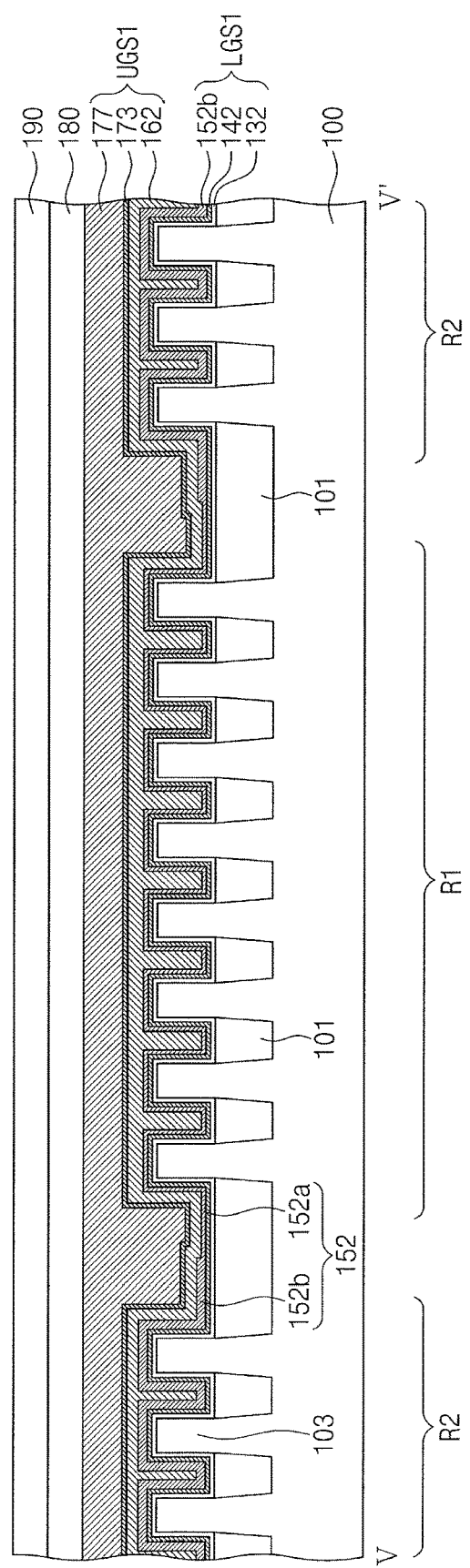

FIG. 10 illustrates an enlarged view of section B, or a portion of a chip region, shown in FIG. 1. FIG. 11 illustrates a plan view showing more detail of a semiconductor device shown in FIG. 10. FIGS. 12A and 12B illustrate cross-sectional views taken along lines IV-IV' and V-V' of FIG. 11, respectively.

Referring to FIG. 10, the chip region of the semiconductor substrate 100 may include the first region R1 and the second region R2, and the second region R2 may be disposed on a perimeter of the first region R1. For example, the second region R2 may be adjacent to the first region R1 in the first direction D1 and the second direction D2.

Referring to FIGS. 11, 12A, and 12B, active patterns AP may protrude from the semiconductor substrate 100 and extend in the first direction D1. One or more of the active patterns AP extending in the first direction R1 may extend across the first and second regions R1 and R2.

In an implementation, a semiconductor device may include the first gate structures GS1 extending across the first and second regions R1 and R2 and the second gate structures GS2 provided on the second region R2.

Each of the first and second gate structures GS1 and GS2 may include, as discussed above, the lower gate structure LGS and the upper gate structure UGS. The lower gate structure LGS may include the high-k dielectric pattern 132, the first barrier metal pattern 142, and the threshold voltage adjusting pattern 152/154.

In this embodiment, in each of the first gate structures GS1, the threshold voltage adjusting pattern 152 may include a first segment 152a having a first thickness on the first region R1 and a second segment 152b having a second thickness on the second region R2. In this configuration, the first thickness may be less than the second thickness. Each of the second gate structures GS2 may have the threshold voltage adjusting pattern 154 having a uniform second thickness.

On the first region R1, the source/drain impurity layers 113 may be formed on the active patterns AP on opposite sides of the first gate structure GS1, and connected to a connecting conductive pattern CP.

The connecting conductive pattern CP may include a metal silicide layer and a metal layer. For example, the metal silicide layer of the connecting conductive pattern CP may include, e.g., one or more of titanium silicide, tantalum silicide, and tungsten silicide. The metal layer of the connecting conductive pattern CP may include, e.g., one or more of titanium, tantalum, and tungsten.

According to exemplary embodiments, second field effect transistors having a second threshold voltage may be disposed around first field effect transistors having a first threshold voltage. Accordingly, field effect transistors with different threshold voltages may be provided with gate electrode structures that are formed to have a substantially same height.

By way of summation and review, as semiconductor devices become highly integrated, the scale down of the MOSFETs may also be accelerated, and operating characteristics of the semiconductor device could possibly deteriorate. The embodiments may provide a semiconductor device having superior performance while overcoming limitations due to integration of the semiconductor device.

The embodiments may provide a semiconductor device including field effect transistors that are formed more uniformly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate including first regions of a first conductivity type and second regions of a second conductivity type different from the first conductivity type, each of the first regions being disposed between adjacent ones of the second regions;
a plurality of first gate structures on each of the first regions of the semiconductor substrate; and
a plurality of second gate structures on each of the second regions of the semiconductor substrate,
wherein each of the first and second gate structures includes:
a lower gate structure including a recess region defined by sidewalls and a bottom connecting the sidewalls; and
an upper gate structure including a gap-fill metal pattern that fills the recess region of the lower gate structure,
wherein the bottom of the lower gate structure included in the first gate structure has a thickness different from a thickness of the bottom of the lower gate structure included in the second gate structure, and
wherein the gap-fill metal patterns of the first and second gate structures have top surfaces at substantially a same level.

2. The semiconductor device as claimed in claim 1, wherein:
each of the lower gate structures of the first and second gate structures includes a high-k dielectric pattern, a barrier metal pattern, and a threshold voltage adjusting pattern that are sequentially stacked, and
the threshold voltage adjusting patterns of the first gate structures are thinner than the threshold voltage adjusting patterns of the second gate structures.

3. The semiconductor device as claimed in claim 1, wherein:
each of the upper gate structures of the first and second gate structures further includes a work function conductive pattern between the gap-fill metal pattern and the lower gate structure, and
the work function conductive pattern has a top surface at substantially a same level as the top surface of the gap-fill metal pattern.

4. The semiconductor device as claimed in claim 3, wherein the work function conductive patterns of the first and second gate structures have substantially the same thickness, and cover the sidewalls and the bottom of the lower gate structure.

5. The semiconductor device as claimed in claim 1, wherein
the upper gate structure of the first gate structure has a first lower width, and
the upper gate structure of the second gate structure has a second lower width, the second lower width being less than the first lower width.

6. The semiconductor device as claimed in claim 1, wherein the first regions and the second regions are alternately disposed along a first direction and a second direction crossing each other.

7. The semiconductor device as claimed in claim 1, wherein, in each of the first and second gate structures, the sidewalls of the lower gate structure have top surfaces that are lower than the top surface of the gap-fill metal pattern.

8. The semiconductor device as claimed in claim 1, further comprising:
first active patterns protruding from the first regions of the semiconductor substrate and extending in one direction; and
second active patterns protruding from the second regions of the semiconductor substrate and extending parallel to the first active patterns,
wherein:
the first gate structures extend across the first active patterns, and
the second gate structures extend across the second active patterns.

9. A semiconductor device, comprising:
a first gate structure extending across first active patterns on a first region of a semiconductor substrate, the first region having a first conductivity type; and
a second gate structure extending across second active patterns on a second region of the semiconductor substrate, the second region having a second conductivity type different from the first conductivity type,
wherein each of the first and second gate structures includes:
a lower gate structure including a recess region defined by sidewalls and a bottom connecting the sidewalls; and
an upper gate structure including a gap-fill metal pattern that fills the recess region of the lower gate structure,
wherein the bottom of the lower gate structure included in the first gate structure has a thickness that is different from a thickness of the bottom of the lower gate structure included in the second gate structure,
wherein the gap-fill metal patterns of the first and second gate structures have top surfaces at substantially a same level,
wherein each of the lower gate structures of the first and second gate structures includes a high-k dielectric pattern, a barrier metal pattern, and a threshold voltage adjusting pattern that are sequentially stacked,
wherein the high-k dielectric patterns and the barrier metal patterns of the first and second gate structures have substantially the same thickness,
wherein the threshold voltage adjusting pattern of the first gate structure has a thickness that is different from a thickness of the threshold voltage adjusting pattern of the second gate structure,
wherein each of the upper gate structures of the first and second gate structures further includes a work function conductive pattern between the gap-fill metal pattern and the lower gate structure, and
wherein the work function conductive pattern has a top surface at substantially a same level as the top surface of the gap-fill metal pattern.

10. The semiconductor device as claimed in claim 9, wherein the sidewalls of the lower gate structure included in the first gate structure have top surfaces at substantially a same level as top surfaces of the sidewalls of the lower gate structure included in the second gate structure.

11. The semiconductor device as claimed in claim 9, wherein the work function conductive patterns of the first and second gate structures have substantially the same thickness, and cover the sidewalls and the bottom of the lower gate structure.

12. The semiconductor device as claimed in claim 9, wherein:
the first and second gate structures have substantially the same line width and extend in one direction, the upper gate structure of the first gate structure have a first lower width, and the upper gate structure of the second gate structure have a second lower width, the second lower width being less than the first lower width.

13. The semiconductor device as claimed in claim 9, wherein, in each of the first and second gate structures, the sidewalls of the lower gate structure have top surfaces that are lower than the top surface of the gap-fill metal pattern.

14. A semiconductor device, comprising:
a semiconductor substrate including a first region of a first conductivity type between adjacent second regions of a second conductivity type different from the first conductivity type;
a plurality of first gate structures on the first region of the semiconductor substrate; and
a plurality of second gate structures on the second regions of the semiconductor substrate,
wherein each of the first gate structures includes:
a U-shaped first lower gate structure; and
a first upper gate structure, the first upper gate including a gap-fill metal pattern that fills the U-shaped first lower gate structure,
wherein each of the second gate structures includes:
a U-shaped second lower gate structure; and
a second upper gate structure, the second upper gate including a gap-fill metal pattern that fills the U-shaped second lower gate structure,
wherein a thickness of the first lower gate structure is different from a thickness of the second lower gate structure,
wherein a top surface of the gap-fill metal pattern of the first gate structure is at substantially a same level as a top surface of the gap-fill metal pattern of the second gate structure.

15. The semiconductor device as claimed in claim 14, wherein:
each of the first lower gate structures and second lower gate structures includes a sequentially stacked high-k dielectric pattern, barrier metal pattern, and threshold voltage adjusting pattern, and
a thickness of the threshold voltage adjusting patterns of the first gate structures is less than a thickness of the threshold voltage adjusting patterns of the second gate structures.

16. The semiconductor device as claimed in claim 14, wherein:
each of the first upper gate structures and second upper gate structures further includes a work function conductive pattern between the gap-fill metal pattern and the corresponding lower gate structure,
the work function conductive pattern has a top surface at substantially a same level as the top surface of the gap-fill metal pattern.

17. The semiconductor device as claimed in claim 14, wherein
the first upper gate structure has a first lower width, and
the second upper gate structure has a second lower width, the second lower width being less than the first lower width.

18. The semiconductor device as claimed in claim 14, further comprising:
first active patterns protruding from the first region of the semiconductor substrate and extending in one direction; and
second active patterns protruding from the second regions of the semiconductor substrate and extending parallel to the first active patterns,
wherein:
the first gate structures extend across the first active patterns, and
the second gate structures extend across the second active patterns.

* * * * *